US012610681B2

(12) United States Patent
Ito et al.

(10) Patent No.: US 12,610,681 B2
(45) Date of Patent: Apr. 21, 2026

(54) PHOTOELECTRIC CONVERSION ELEMENT, PHOTOELECTRIC CONVERSION MODULE, ELECTRONIC DEVICE, AND POWER SUPPLY MODULE

(71) Applicants: Takaya Ito, Shizuoka (JP); Ryota Arai, Shizuoka (JP); Tomoya Hirano, Tokyo (JP)

(72) Inventors: Takaya Ito, Shizuoka (JP); Ryota Arai, Shizuoka (JP); Tomoya Hirano, Tokyo (JP)

(73) Assignee: Ricoh Company, Ltd., Tokyo (JP)

( * ) Notice: Subject to any disclaimer, the term of this patent is extended or adjusted under 35 U.S.C. 154(b) by 13 days.

(21) Appl. No.: 18/550,254

(22) PCT Filed: Mar. 10, 2022

(86) PCT No.: PCT/IB2022/052133
§ 371 (c)(1),
(2) Date: Sep. 12, 2023

(87) PCT Pub. No.: WO2022/200898
PCT Pub. Date: Sep. 29, 2022

(65) Prior Publication Data

US 2024/0206200 A1 Jun. 20, 2024

(30) Foreign Application Priority Data

Mar. 22, 2021 (JP) ................................ 2021-047775

(51) Int. Cl.
*H10K 30/88* (2023.01)
*H10K 30/30* (2023.01)

(52) U.S. Cl.
CPC ............. *H10K 30/88* (2023.02); *H10K 30/30* (2023.02)

(58) Field of Classification Search
CPC ...... H01L 31/00-078; Y02E 10/50-60; H10K 30/50-89
(Continued)

(56) References Cited

U.S. PATENT DOCUMENTS

| | | | | |
|---|---|---|---|---|
| 2011/0086462 A1* | 4/2011 | Ovshinsky | ............ | H01L 31/206 257/E31.127 |
| 2012/0094131 A1* | 4/2012 | Takanashi | ................ | C08J 7/048 428/421 |

(Continued)

FOREIGN PATENT DOCUMENTS

| | | | |
|---|---|---|---|
| EP | 3509118 | A1 | 7/2019 |
| JP | H03-116878 | A | 5/1991 |

(Continued)

OTHER PUBLICATIONS

JP-2009267196-A English (Year: 2009).*

(Continued)

*Primary Examiner* — Bach T Dinh
(74) *Attorney, Agent, or Firm* — Grüneberg Global IP PLLC

(57) ABSTRACT

A photoelectric conversion element includes a first electrode (13), a photoelectric conversion layer (16) over the first electrode, and a second electrode (18) over the photoelectric conversion layer. The photoelectric conversion element further includes a surface protection portion (19) adjacent to a face of one electrode selected from the first electrode and the second electrode where the face does not face the photoelectric conversion layer. The surface protection portion contains a compound derived from a fluorine-based silane compound.

16 Claims, 7 Drawing Sheets

(58) Field of Classification Search
USPC .................................................. 136/243–265
See application file for complete search history.

(56) References Cited

U.S. PATENT DOCUMENTS

| | | | | |
|---|---|---|---|---|
| 2012/0125431 | A1 | 5/2012 | Oizumi et al. | |
| 2012/0241889 | A1* | 9/2012 | Takemura | B32B 9/04 427/508 |
| 2014/0264184 | A1 | 9/2014 | Arai et al. | |
| 2015/0041724 | A1 | 2/2015 | Arai et al. | |
| 2015/0158814 | A1 | 6/2015 | Yanagawa et al. | |
| 2015/0280142 | A1 | 10/2015 | Arai et al. | |
| 2016/0260912 | A1 | 9/2016 | Arai et al. | |
| 2017/0222150 | A1 | 8/2017 | Arai et al. | |
| 2017/0338424 | A1* | 11/2017 | Arai | C07D 495/04 |
| 2021/0043846 | A1 | 2/2021 | Arai et al. | |
| 2021/0296603 | A1 | 9/2021 | Arai et al. | |

FOREIGN PATENT DOCUMENTS

| | | | | | |
|---|---|---|---|---|---|
| JP | 2009267196 | A | * | 11/2009 | |
| JP | 2014-220333 | A | | 11/2014 | |
| JP | 2017-069395 | A | | 4/2017 | |
| JP | 2018026439 | A | * | 2/2018 | |
| JP | 2018-107350 | A | | 7/2018 | |
| JP | 2020-025068 | A | | 2/2020 | |
| JP | 6758725 | B1 | | 9/2020 | |
| JP | 6758735 | B1 | * | 9/2020 | |
| WO | 2010/150759 | A1 | | 12/2010 | |
| WO | 2011/074440 | A1 | | 6/2011 | |
| WO | WO-2020026752 | A1 | * | 2/2020 | H10K 30/35 |

OTHER PUBLICATIONS

Blouin et al., Toward a Rational Design of Poly(2,7-Carbazole) Derivatives for Solar Cells, J. Am. Chem. Soc., 2008, 130, 732-742 ( Year: 2008).*

JP-2018026439-A English (Year: 2018).*

JP-6758735-B1 English (Year: 2020).*

International Search Report and Written Opinion issued on Jul. 28, 2022 in PCT/IB2022/052133 filed on Mar. 10, 2022.

Harrison K. H. Lee, et al., "Is organic photovoltaics promising for indoor applications?" Applied Physics letters 108.253301 (2016):1-5.

Shigehiko Mori, et al., "Investigation of the organic solar cell chaaracteristics for indoor LED light applications" Japanese Journal of Applied Physics 54,071602 (2015): 1-6.

Office Action received for Japanese Patent Application No. 2021-047775, mailed on Jan. 30, 2025, 12 pages with English translation.

Teshima et al., "Gas Barrier Performance of Surface-Modified Silica Films with Grafted Organosilane Molecules", Langmuir, vol. 19, No. 20, Aug. 30, 2003, pp. 8331-8334.

* cited by examiner

PHOTOELECTRIC CONVERSION ELEMENT, PHOTOELECTRIC CONVERSION MODULE, ELECTRONIC DEVICE, AND POWER SUPPLY MODULE

CROSS-REFERENCE TO RELATED APPLICATIONS

This application is the National Stage entry under § 371 of International Application No. PCT/IB2022/052133, filed on Mar. 10, 2022, and which claims the benefit of priority to Japanese Application No. 2021-047775, filed on Mar. 22, 2021. The content of each of these applications is hereby incorporated by reference in its entirety.

TECHNICAL FIELD

The present disclosure relates to a photoelectric conversion element, a photoelectric conversion module, an electronic device, and a power supply module.

BACKGROUND ART

In recent years, achievement of Internet of Things (IOT) society, in which everything is connected to the Internet to enable comprehensive control, has been expected. To achieve such an IoT society, a large number of sensors are required to be coupled to various things to obtain data, but power supplies that drive such a large number of sensors are needed. Wiring to the various sensors and use of storage cells are impractical, and power supply achieved by an environmental power generation element is expected because of an increase in a social need for reducing environmental load.

Among others, photoelectric conversion elements have been attracting attention as elements that can generate electricity anywhere if light is available. In particular, flexible photoelectric conversion elements have been expected to be highly efficient and also be applicable to, for example, wearable devices by virtue of their followability to variously curved surfaces. For example, NPL 1 and NPL 2 report the results of studies on applicability of photoelectric conversion elements to wearable devices.

In general, as highly efficient flexible environmental power generation elements, organic thin-film solar cells are considered to be promising. PTL 1 proposes a photoelectric conversion element including a transparent base film as a base.

A photoelectric conversion element in a typical organic thin-film solar cell has a structure including a first electrode, an electron transporting layer, a photoelectric conversion layer, a hole transporting layer, and a second electrode that are stacked in this order on or above a base serving as a support substrate. Also, in order to increase durability of the photoelectric conversion element, the configuration where a surface protection portion and a scaling member are further stacked in this order on or above the electrode has become mainstream. One example of the specific functions of the surface protection portion is increasing durability during storage, such as anti-corrosion and anti-deterioration on the electrode. Another example is that the surface protection portion provided between the electrode and the scaling member can prevent direct contact of an adhesive member forming the sealing member with the electrode to prevent detachment of the electrode, which would otherwise occur due to transfer of the electrode-forming material to the side of the adhesive member.

CITATION LIST

Patent Literature

PTL 1

Japanese Unexamined Patent Application Publication No. 2014-220333

Non-Patent Literature

NPL 1

*Applied Physics letters,* 108, 253301 (2016)

NPL 2

*Japanese Journal of Applied Physics,* 54, 071602 (2015)

SUMMARY OF INVENTION

Technical Problem

Even in the photoelectric conversion element provided with a surface protection portion on the electrode, when the photoelectric conversion element is bent, the electrode is detached and durability during storage decreases.

Solution to Problem

According to one aspect of the present disclosure, a photoelectric conversion element includes a first electrode, a photoelectric conversion layer over the first electrode, and a second electrode over the photoelectric conversion layer. The photoelectric conversion element further includes a surface protection portion adjacent to a face of one electrode selected from the first electrode and the second electrode where the face does not face the photoelectric conversion layer. The surface protection portion contains a compound derived from a fluorine-based silane compound.

Advantageous Effects of Invention

The present disclosure can provide a photoelectric conversion element that is prevented from detachment of the electrode and decreasing in durability during storage even when the photoelectric conversion element is bent.

BRIEF DESCRIPTION OF DRAWINGS

The accompanying drawings are intended to depict example embodiments of the present invention and should not be interpreted to limit the scope thereof. The accompanying drawings are not to be considered as drawn to scale unless explicitly noted. Also, identical or similar reference numerals designate identical or similar components throughout the several views.

DESCRIPTION OF EMBODIMENTS

Figure 1:
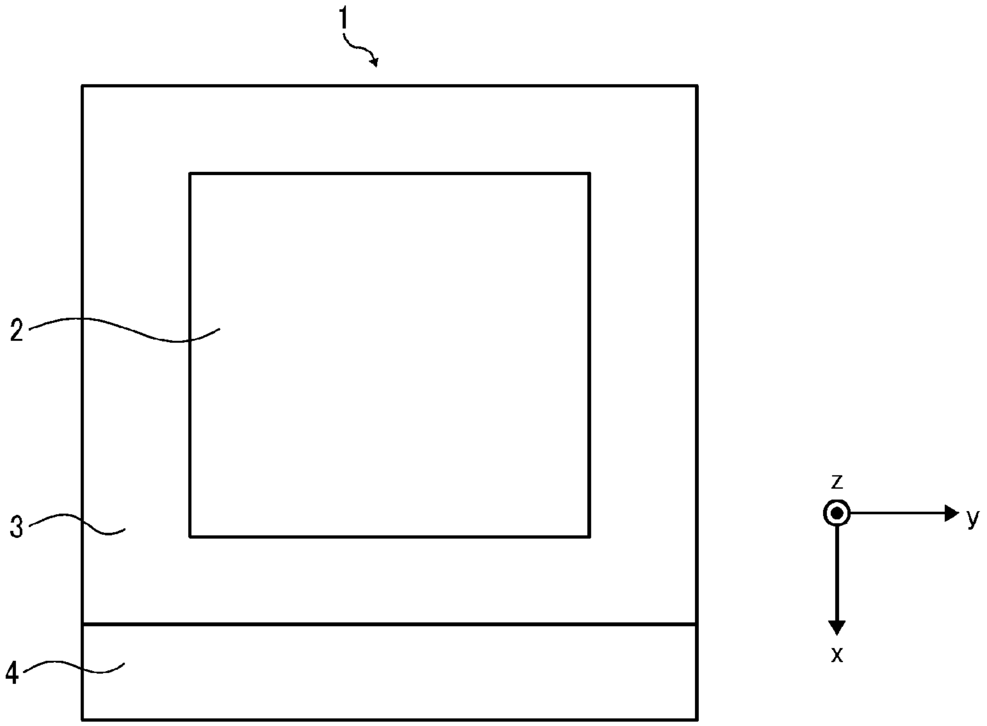
FIG. 1 is a schematic diagram illustrating one example of a photoelectric conversion element as viewed from the above.

<<Photoelectric Conversion Element for Organic Thin-Film Solar Cell>>

The "photoelectric conversion element" refers to an element that converts light energy to electric energy or an element that converts electric energy to light energy. Specifically, the photoelectric conversion element is, for example, an element forming a solar cell, a photodiode, etc. Examples of the solar cell include, but are not limited to, an organic thin-film solar cell, a dye-sensitized solar cell, and a perovskite solar cell. In the present disclosure, first, the photoelectric conversion element constituting the organic thin-film solar cell will be described below, but the dye-sensitized solar cell and the perovskite solar cell will also be described.

The photoelectric conversion element includes a first electrode, a photoelectric conversion layer over the first electrode, and a second electrode over the photoelectric conversion layer. In other words, the photoelectric conversion element includes a first electrode, a photoelectric conversion layer, and a second electrode sequentially. The term "sequentially" means that these electrodes and the layer are arranged in the order mentioned above as a whole, and any other layers may be inserted between each of the electrodes and the layer. The photoelectric conversion element including the other layers that are inserted therebetween is, for example, a photoelectric conversion element sequentially including the first electrode, an electron transporting layer, the photoelectric conversion layer, a hole transporting layer, and the second electrode. In this case, moreover, other additional layers may be inserted between each of the electrodes and the layer or between the layers. Also, the term "sequentially" means that these electrodes and layers may be stacked in order from the side of the first electrode or these electrodes and layers may be stacked in order from the side of the second electrode. Specifically, as observed from the side of the light incident surface, the photoelectric conversion element may be such that the first electrode, the photoelectric conversion layer, and the second electrode are stacked in the order mentioned, or may be such that the second electrode, the photoelectric conversion layer, and the first electrode are stacked in the order mentioned. When the photoelectric conversion element includes an electron transporting layer and a hole transporting layer, as observed from the side of the light incident surface, the photoelectric conversion element may be such that the first electrode, the electron transporting layer, the photoelectric conversion layer, the hole transporting layer, and the second electrode are stacked in the order mentioned, or may be such that the second electrode, the hole transporting layer, the photoelectric conversion layer, the electron transporting layer, and the first electrode in the order mentioned. In the present disclosure, description will be mainly made for the photoelectric conversion element where the first electrode, the electron transporting layer, the photoelectric conversion layer, the hole transporting layer, and the second electrode are stacked in the order mentioned, as observed from the side of the light incident surface. However, the present photoelectric conversion element is not limited to this configuration. Persons skilled in the art could easily understand other configurations from the below-given description, such as a photoelectric conversion element where the second electrode, the hole transporting layer, the photoelectric conversion layer, the electron transporting layer, and the first electrode are stacked in the order mentioned, as observed from the side of the light incident surface.

The photoelectric conversion element includes a surface protection portion. The surface protection portion is provided adjacent to a face of one electrode selected from the first electrode and the second electrode (hereinafter the electrode selected as the one electrode may also be referred to as "one electrode") where the face does not face the photoelectric conversion layer. In the present disclosure, the "one electrode" is an electrode provided at a farther position from the light incident surface in the first electrode and the second electrode. The other electrode selected from the first electrode and the second electrode (hereinafter the electrode selected as the other electrode may also be referred to as "other electrode") is an electrode provided at a nearer position to the light incident surface in the first electrode and the second electrode. The "face that does not face the photoelectric conversion layer" is a face located at an opposite side to the face that faces directly or indirectly via other layers the photoelectric conversion layer.

The photoelectric conversion element preferably includes a sealing member. The sealing member is provided adjacent to the surface protection portion and preferably encloses the surface protection portion, the one electrode, and the photoelectric conversion layer. When the photoelectric conversion element includes an electron transporting layer and a hole transporting layer, the scaling member preferably encloses the electron transporting layer and the hole transporting layer as well.

If necessary, the photoelectric conversion element includes, for example, a base and a UV cut layer.

When the photoelectric conversion element includes a base, a preferable configuration of the photoelectric conversion element as observed from the side of the light incident surface is: a configuration where the base, the first electrode, the electron transporting layer, the photoelectric conversion layer, the hole transporting layer, and the second electrode are stacked in the order mentioned; or a configuration where the base, the second electrode, the hole transporting layer, the photoelectric conversion layer, the electron transporting layer, and the first electrode are stacked in the order mentioned. The base is preferably provided adjacent to the other electrode at a side of a face of the other electrode where the face does not face the photoelectric conversion layer.

<Base>

The "base" is a member configured to support, for example, the electrodes and the layers that form the photoelectric conversion element. From the viewpoint of increasing photoelectric conversion efficiency, the base is preferably high in light transmittivity and more preferably transparent. From the viewpoint of broadening applications of the photoelectric conversion element, the base is preferably high in flexibility.

Examples of the material of the base having transparency and flexibility include, but are not limited to: resin films of, for example, polyesters such as polyethylene terephthalate, polycarbonates, polyimides, polymethyl methacrylates, polysulfones, and polyether ether ketone; and glass thin films (average thickness: 200 μm or less). Of these materials, from the viewpoints of casiness to produce and of cost, resin films of polyesters and polyimides, and glass thin films are preferable. When the resin film or the glass thin film is used as the base, the thickness of the base is preferably 200 μm or less. When the thickness of the base is 200 μm or less, the base has increased flexibility. As a result, even when the photoelectric conversion element is bent, durability thereof increases. The thickness of the base can be measured with a known method, such as a method using a contact-type thickness meter. Examples of the material of the base having transparency but having no flexibility include, but are not limited to, inorganic transparent crystals such as glass films other than glass thin films (in other words, glass films having a thickness of more than 200 μm). These materials are preferable because they have no flexibility but have high flatness.

The base preferably has gas barrier property. The gas barrier property is the function of preventing transmission of water vapor and oxygen. In the present disclosure, the "base having gas barrier property" is not limited to a base that intrinsically has gas barrier property, and also includes a stack including a base and a gas barrier layer, which is at a location adjacent to the base and has gas barrier property. The base having gas barrier property can provide a photoelectric conversion element that is better prevented from decreasing in photoelectric conversion efficiency; i.e., has high durability during storage, even if the photoelectric conversion element is placed in a high-temperature, high-humidity environment for a long period of time. The gas barrier layer will be described below.

The function required for the base having gas barrier property is typically represented by, for example, a water vapor transmission rate or an oxygen transmission rate. Preferably, the water vapor transmission rate per day according to the method stipulated by JIS (Japanese Industrial Standards) K7129 B is, for example, 10 $g/m^2$ or lower, and the lower it is, the more preferable. Preferably, the oxygen transmission rate per day according to the method stipulated by JIS K7126-2 is, for example, 1 $cm^3/m^2 \cdot atm$ or lower, and the lower it is, the more preferable.

As the resin film having gas barrier property, a known resin film may be appropriately used. Examples thereof include, but are not limited to, aluminum-coated resin films and silicon oxide-coated resin films.

<First Electrode>

The "first electrode" is an electrode configured to collect electrons generated through photoelectric conversion. When the first electrode is provided on the light incident surface side, the first electrode is preferably high in light transmission and more preferably transparent from the viewpoint of increasing photoelectric conversion efficiency. When the first electrode is provided on the opposite side to the light incident surface, light transmission and transparency may be low.

As the first electrode having transparency, a transparent electrode may be used that is an electrode transparent to visible light. The transparent electrode is, for example, a structure including a transparent conductive film, a metal thin film, and a transparent conductive film that are sequentially stacked. The two transparent conductive films, which sandwich the metal thin film, may be formed of the same material or of different materials.

Examples of the material of the transparent conductive film include, but are not limited to, tin-doped indium oxide (ITO), zinc-doped indium oxide (IZO), zinc oxide (ZnO), fluorine-doped tin oxide (FTO), aluminum-doped zinc oxide (AZO), gallium-doped zinc oxide (GZO), tin oxide ($SnO_2$), silver nanowires, and nanocarbons (e.g., carbon nanotubes and graphene). Of these materials, preferable are tin-doped indium oxide (ITO), zinc-doped indium oxide (IZO), and aluminum-doped zinc oxide (AZO).

Examples of the material of the metal thin film include, but are not limited to, metals such as aluminum, copper, silver, gold, platinum, and nickel.

The first electrode having transparency is preferably integrated in use with the above base from the viewpoint of maintaining rigidity. Examples of such integrated products include, but are not limited to, FTO-coated glass, ITO-coated glass, aluminum-coated glass, FTO-coated transparent plastic films, ITO-coated transparent plastic films, and ITO/silver/ITO stack-coated plastic films.

Examples of the material of the first electrode having no transparency include, but are not limited to, metals such as platinum, gold, silver, copper, and aluminum, and graphite.

The average thickness of the first electrode is preferably 5 nm or greater but 10 μm or less and more preferably 50 nm or greater but 1 μm or less.

The sheet resistance of the first electrode is preferably 50 Ω/sq. or lower, more preferably 30 Ω/sq. or lower, and further preferably 20/Ωsq. or lower.

When the first electrode has transparency, the light transmittance of the first electrode is preferably 60% or higher, more preferably 70% or higher, further preferably 80% or higher, and particularly preferably 90% or higher. The upper limit of the light transmittance is not particularly limited and may be appropriately selected depending on the intended purpose.

The first electrode can be formed through wet film formation, dry film formation such as vapor deposition or sputtering, or printing.

<Electron Transporting Layer>

The "electron transporting layer" is a layer configured to transport electrons generated in the photoelectric conversion layer and prevent entry of holes generated in the photoelectric conversion layer. In the configuration, one electron transporting layer may be present or two or more electron transporting layers may be present. As one example, the following is described about the configuration including two electron transporting layers. Specifically, this is a configuration including a first electron transporting layer and a second electron transporting layer (which may also be referred to as an "intermediate layer") that is provided between the first electron transporting layer and the photoelectric conversion layer. When the intended configuration includes one electron transporting layer, the one electron transporting layer is preferably the same layer as the first electron transporting layer.

First Electron Transporting Layer

The first electron transporting layer is preferably a layer containing particles of a metal oxide. Examples of the metal oxide include, but are not limited to: oxides of, for example, titanium, zinc, lithium, and tin; and ITO, FTO, ATO, AZO, and GZO. Of these, zinc oxide is preferable, and in order to increase conductivity, a doped zinc oxide is more preferable. Examples of the doped zinc oxide include, but are not limited to, aluminum-doped zinc oxide, gallium-doped zinc oxide, and lithium-doped zinc oxide. The metal oxide for use may be a metal oxide formed of, for example, an alkoxide of a metal serving as a raw material.

The average particle diameter of the particles of the metal oxide is preferably 1 nm or more but 50 nm or less and more preferably 5 nm or more but 20 nm or less.

The average particle diameter of the particles of the metal oxide is calculated by measuring 100 or more randomly selected metal oxide particles for particle diameter in the following manner, for example, and by determining the average of the measurements obtained. First, a dispersion liquid containing the particles of the metal oxide is transferred to a nebulizer made of glass using a micropipette. Next, the dispersion liquid is sprayed from the nebulizer to a grid for a TEM and with a collodion film. Using PVD, the grid is allowed to undergo carbon vapor deposition. Under an electron microscope, an image of the particles of the metal oxide is obtained. The obtained image is subjected to image processing to measure the particle diameters of the particles of the metal oxide. Alternatively, the cross-section of the photoelectric conversion element may be observed under a scanning transmission electron microscope (TEM) to perform particle recognition through image processing, to thereby measure the particle diameters of the particles of the metal oxide. Also, the particle size distribution may be measured by, for example, a laser diffraction and scattering method. Known methods can be employed for a method of exposing the cross-section of the photoelectric conversion element, observation under a TEM, and measurement of the particle size distribution.

The average thickness of the first electron transporting layer is preferably 1 nm or greater but 300 nm or less and more preferably 10 nm or greater but 150 nm or less.

An exemplary method for forming the first electron transporting layer is a method of applying a dispersion liquid containing the particles of the metal oxide and a dispersion medium, followed by drying. Examples of the dispersion medium include, but are not limited to, alcohols such as methanol, ethanol, isopropanol, 1-propanol, 2-methoxyethanol, and 2-ethoxyethanol, and mixtures thereof.

Second Electron Transporting Layer (Intermediate Layer)

The second electron transporting layer is preferably a layer containing an amine compound. The amine compound is not particularly limited as long as it is a material that can increase photoelectric conversion efficiency of the photoelectric conversion element as a result of formation of the second electron transporting layer. For example, an amine compound represented by General Formula (4) below is preferably used.

[Chem. 1]

General Formula (4)

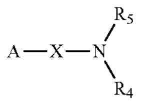

In the above General Formula (4), $R_4$ and $R_5$ each independently represent an alkyl group which may have a substituent and contains carbon atoms of 1 or more but 4 or less, or represent a ring structure where $R_4$ and $R_5$ are bonded to each other. Preferably, $R_4$ and $R_5$ represent an alkyl group which may have a substituent and contains carbon atoms of 1 or more but 4 or less. More preferably, $R_4$ and $R_5$ each independently represent an alkyl group which has no substituent and contains carbon atoms of 1 or more but 4 or less. Examples of the substituent include, but are not limited to, a methyl group, an ethyl group, and a hydroxyl group. The number of carbon atoms in the above ring structure is preferably 3 or more but 6 or less. When $R_4$ and $R_5$ each independently represent an alkyl group which may have a substituent and contains carbon atoms of 1 or more but 4 or less, the alkyl group represented by $R_4$ and the alkyl group represented by $R_5$ may be identical to or different from each other.

In the above General Formula (4), X represents a divalent aromatic group having carbon atoms of 6 or more but 14 or less or an alkyl group having carbon atoms of 1 or more but 4 or less. X is preferably a divalent aromatic group having carbon atoms of 6 or more but 14 or less.

In the above General Formula (4), A represents a substituent of Structural Formula (1), (2), or (3). A is preferably a substituent of Structural Formula (1).

[Chem. 2]

—COOH Structural Formula (1)

[Chem. 3]

$-P(=O)(OH)_2$ Structural Formula (2)

[Chem. 4]

$-Si(OH)_3$ Structural Formula (3)

Examples of the amine compound other than those represented by the above General Formula (4) include, but are not limited to, 3-aminopropyltriethoxysilane, 3-aminopropyltriethoxysilane, 3-aminopropyldiethoxymethylsilane, 3-(2-aminoethylamino)propyltriethoxysilane, 3-(2-aminoethylamino)propyldimethoxymethylsilane, 3-(2-aminoethylamino)propyltriethoxysilane, trimethoxy[3-(phenylamino)propyl]silane, trimethoxy[3-(methylamino)propyl]silane, bis[3-(trimethoxysilyl)propyl]amine, bis[3-(triethoxysilyl)propyl]amine, and N,N'-bis[3-(trimethoxysilyl)propyl]ethane-1,2-diamine.

An exemplary method for forming the second electron transporting layer is a method of applying a solution containing the amine compound through, for example, spin coating or dipping, followed by drying.

<Photoelectric Conversion Layer>

The "photoelectric conversion layer" is a layer configured to absorb light to generate electrons and holes. The photoelectric conversion layer contains two or more kinds of organic materials. Specifically, the photoelectric conversion layer contains an electron-donating organic material (which may also be referred to as a p-type organic semiconductor material) and an electron-accepting organic material (which may also be referred to as a n-type organic semiconductor material). The electron-donating organic material and the electron-accepting organic material may each use two or more kinds of organic materials. It is preferable that the photoelectric conversion layer contain three or more kinds of organic materials. Also, in the photoelectric conversion layer, the electron-donating organic material and the electron-accepting organic material are preferably mixed to form a bulk heterostructure.

Electron-Donating Organic Material

The electron-donating organic material is preferably a π-electron conjugated compound having a highest occupied molecular orbital (HOMO) level of 4.8 eV or higher but 5.7 eV or lower and more preferably a π-electron conjugated compound having a HOMO level of 5.1 eV or higher but 5.5 eV or lower or a π-electron conjugated compound having a HOMO level of 5.2 eV or higher but 5.6 eV or lower.

The highest occupied molecular orbital (HOMO) level can be measured through, for example, photoelectron spectroscopy or cyclic voltammetry. Specifically, it can be measured using a device such as AC-3 available from RIKEN KEIKI CO., LTD.

Examples of the electron-donating organic material include, but are not limited to: conjugated polymers coupled with various aromatic derivatives (e.g., thiophene, fluorene, carbazole, thienothiophene, benzodithiophene, dithienosilole, quinoxaline, and benzothiadiazole); and porphyrins and phthalocyanines which are low-molecular-weight conjugated compounds. The electron-donating organic material may be a donor-acceptor linked material having an electron-donating moiety and an electron-accepting moiety in a molecule thereof.

The number average molecular weight (Mn) of the electron-donating organic material is preferably 10,000 or lower and more preferably 5,000 or lower when the electron-donating organic material is a low-molecular-weight material. It is preferably 10,000 or higher when the electron-donating organic material is a polymer.

One preferable example of the electron-donating organic material is an organic material having a highest occupied molecular orbital (HOMO) level of 5.1 eV or higher but 5.5 eV or lower and a number average molecular weight (Mn) of 10,000 or lower. Such an organic material is, for example, a compound represented by General Formula (1) below.

[Chem. 5]

General Formula (1)

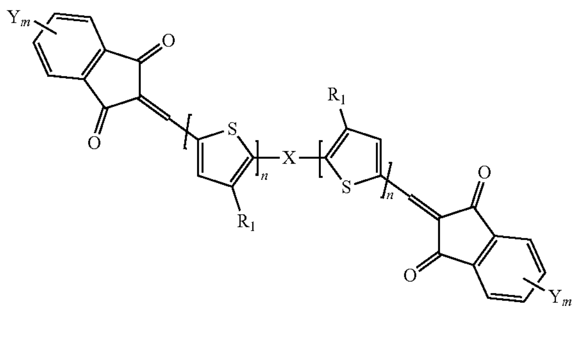

In the above General Formula (1), $R_1$ represents an alkyl group having carbon atoms of 2 or more but 8 or less.

In the above General Formula (1), n represents an integer of 1 or greater but 3 or smaller.

In the above General Formula (1), Y represents a halogen atom.

In the above General Formula (1), m represents an integer of 0 or greater but 4 or smaller.

In the above General Formula (1), X represents General Formula (2) below or General Formula (3) below.

[Chem. 6]

General Formula (2)

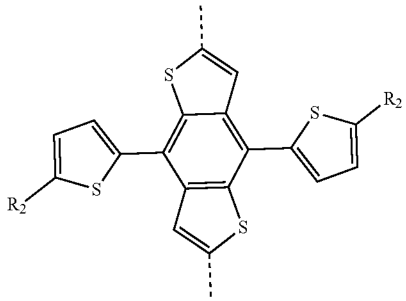

[Chem. 7]

General Formula (3)

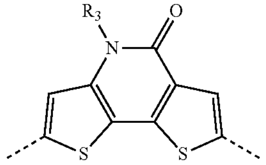

In the above General Formula (2), $R_2$ represents a straight-chain or branched alkyl group and is preferably a straight-chain or branched alkyl group having carbon atoms of 2 or more but 30 or less.

In the above General Formula (3), $R_3$ represents a straight-chain or branched alkyl group and is preferably a straight-chain or branched alkyl group having carbon atoms of 2 or more but 30 or less.

Another preferable example of the electron-donating organic material is an organic material having a highest occupied molecular orbital (HOMO) level of 5.2 eV or higher but 5.6 eV or lower and a number average molecular weight (Mn) of 10,000 or higher. This organic material is preferably used in combination with the above organic material having a highest occupied molecular orbital (HOMO) level of 5.1 eV or higher but 5.5 eV or lower and a number average molecular weight (Mn) of 10,000 or lower.

Examples of the organic material having a highest occupied molecular orbital (HOMO) level of 5.2 eV or higher but 5.6 eV or lower and a number average molecular weight (Mn) of 10,000 or higher include, but are not limited to, 2,1,3-benzothiadiazole-thiophene-based copolymers, quinoxaline-thiophene-based copolymers, thiophene-benzodithiophene-based copolymers, and polyfluorene-based polymers.

The 2,1,3-benzothiadiazole-thiophene-based copolymer is a conjugated copolymer having, in a main chain, a thiophene backbone and a 2,1,3-benzothiadiazole backbone. Specific examples of the 2,1,3-benzothiadiazole-thiophene-based copolymer include, but are not limited to, those represented by General Formulae (5) to (8) below. In the General Formulae (5) to (8) below, n each independently represents an integer of 1 or greater but 1,000 or smaller.

[Chem. 8]

General Formula (5)

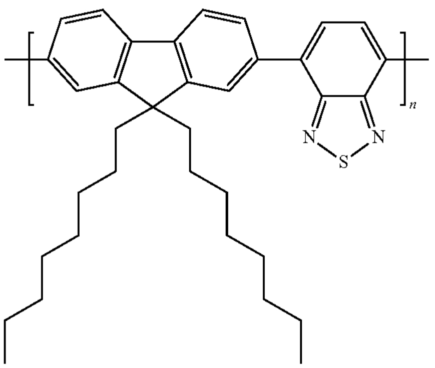

[Chem. 9]

General Formula (6)

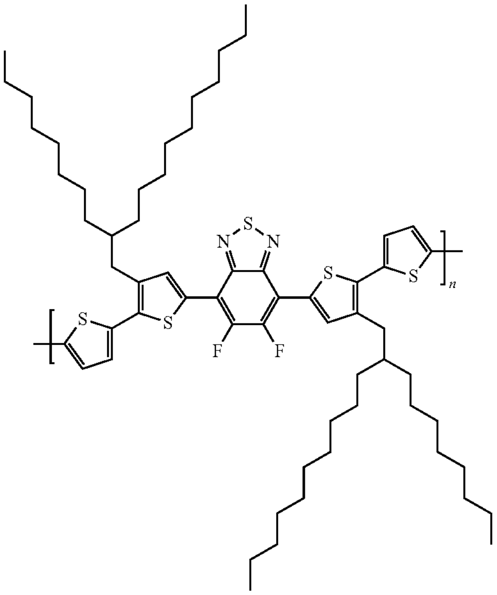

-continued

[Chem. 10]

General Formula (7)

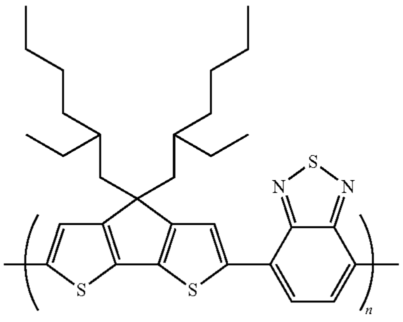

[Chem. 11]

General Formula (8)

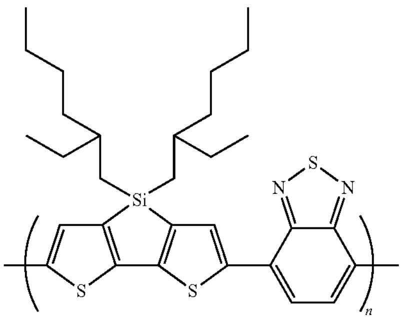

The quinoxaline-thiophene-based copolymer is a conjugated copolymer having, in a main chain, a thiophene backbone and a quinoxaline backbone. Specific examples of the quinoxaline-thiophene-based copolymer include, but are not limited to, those represented by General Formula (9) below. In the General Formula (9) below, n represents an integer of 1 or greater but 1,000 or smaller.

[Chem. 12]

General Formula (9)

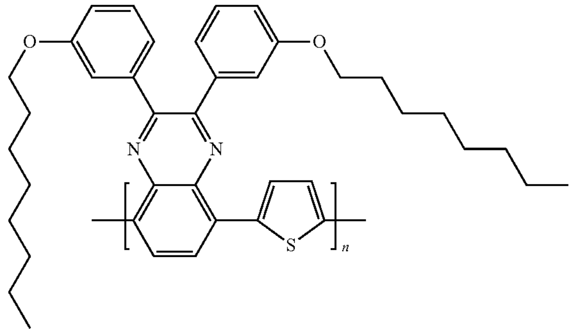

The thiophene-benzodithiophene-based copolymer is a conjugated copolymer having, in a main chain, a thiophene backbone and a benzodithiophene backbone. Specific examples of the thiophene-benzodithiophene-based copolymer include, but are not limited to, those represented by General Formulae (10) to (13) below. In the General Formulae (10) to (13) below, n each independently represents an integer of 1 or greater but 1,000 or smaller.

[Chem. 13]

General Formula (10)

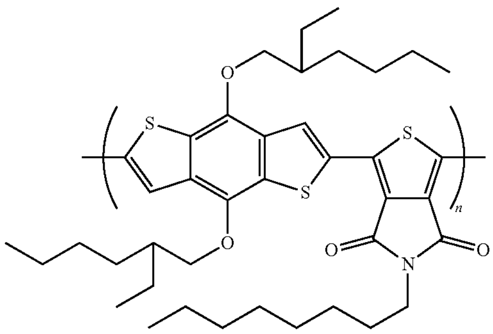

[Chem. 14]

General Formula (11)

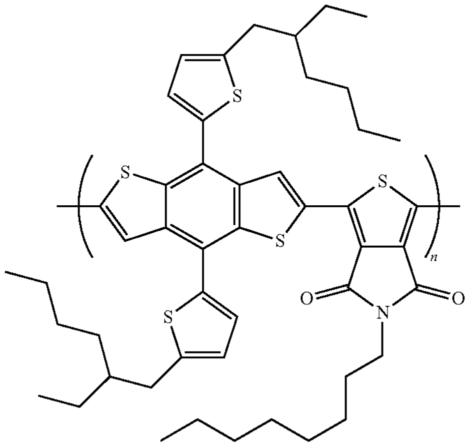

[Chem. 15]

General Formula (12)

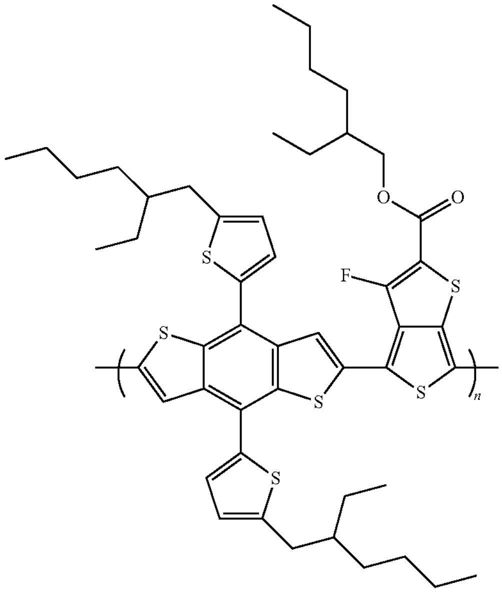

-continued

[Chem. 16]

General Formula (13)

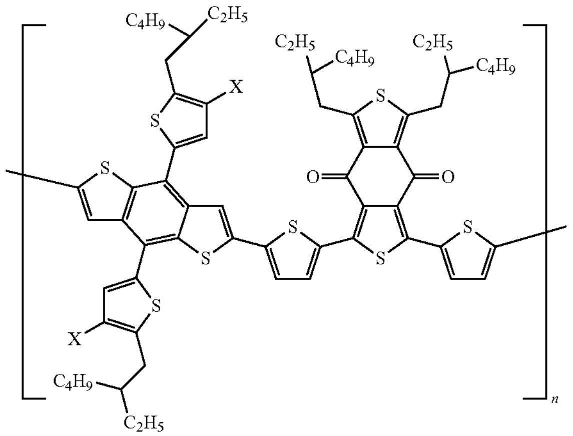

X = H, F, Cl, Br, I

Electron-Accepting Organic Material

The electron-accepting organic material is preferably a π-electron conjugated compound having a lowest unoccupied molecular orbital (LUMO) level of 3.5 eV or higher but 4.5 eV or lower.

Examples of the electron-accepting organic material include, but are not limited to, fullerenes or derivatives thereof, naphthalene tetracarboxylic acid imide derivatives, and perylene tetracarboxylic acid imide derivatives. Of these, fullerene derivatives are preferable. Examples of the fullerene derivatives include, but are not limited to, $C_{60}$, phenyl-$C_{61}$-methyl butyrate (fullerene derivatives described as PCBM, [60]PCBM, or $PC_{61}BM$ in, for example, some publicly known documents), $C_{70}$, phenyl-$C_{71}$-methyl butyrate (fullerene derivatives described as PCBM, [70]PCBM, or $PC_{71}BM$ in, for example, some publicly known documents), and fulleropyrrolidine-based fullerene derivatives represented by General Formula (14) below.

[Chem. 17]

General Formula (14)

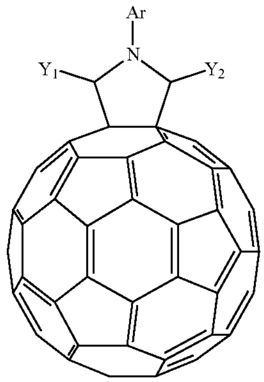

In the above General Formula (14), $Y_1$ and $Y_2$ each independently represent a hydrogen atom, an alkyl group, an alkenyl group, an alkynyl group, an aryl group, or an aralkyl group, provided that $Y_1$ and $Y_2$ are not a hydrogen atom at the same time. The alkyl group, the alkenyl group, the alkynyl group, the aryl group, or the aralkyl group may have or may not have a substituent.

In the above General Formula (14), Ar represents an aryl group, provided that the aryl group may have or may not have a substituent.

Average Thickness of the Photoelectric Conversion Layer

The average thickness of the photoelectric conversion layer is preferably 50 nm or more but 400 nm or less and more preferably 60 nm or more but 250 nm or less. When the average thickness thereof is 50 nm or more, a sufficient number of carriers are generated by the photoelectric conversion layer through light absorption. When the average thickness thereof is 400 nm or less, reduction in transportation efficiency of carriers generated through light absorption is prevented.

The average thickness of the photoelectric conversion layer is calculated by measuring the thickness of the photoelectric conversion layer at 9 randomly selected points in the following manner, for example, and by determining the average of the measurements obtained. First, a liquid containing materials forming the photoelectric conversion layer is applied on a base and dried, and then a solvent is used to wipe off the resultant at any points. Using DEKTAK available from Bruker Corporation, the heights of the level differences at the wiped sites, and the average value of the obtained measurements is defined as the average thickness. Alternatively, the cross-section of the photoelectric conversion element may be observed under a scanning electron microscope (SEM) or a transmission electron microscope (TEM) to measure the average thickness of the photoelectric conversion layer.

Method for Forming a Bulk Heterojunction in the Photoelectric Conversion Layer

The photoelectric conversion layer may be formed by sequentially stacking layers of the above organic materials as a layer having a planar junction interface. In order to enlarge the area of the junction interface, preferably, the above organic materials are three-dimensionally mixed to form a bulk heterojunction. The bulk heterojunction is formed in the following manner, for example.

When the organic materials have high solubility, the bulk heterojunction is formed by dissolving the organic materials in a solvent to prepare a solution where the organic materials are mixed at a molecular level, and by applying the solution and then drying to remove the solvent. In this case, a heating treatment may further be performed to optimize the aggregated state of the organic materials.

When the organic materials have low solubility, the bulk heterojunction is formed by dissolving one of the organic materials to prepare a solution and dispersing another one of the organic materials in the solution to prepare a liquid, and by applying the liquid and then drying to remove the solvent. In this case, a heating treatment may further be performed to optimize the aggregated state of the organic materials.

Method for Forming the Photoelectric Conversion Layer

A method for forming the photoelectric conversion layer includes a step of applying the liquid containing the above organic materials. Examples of a method of applying the liquid include, but are not limited to, spin coating, blade coating, slit die coating, screen printing coating, bar coater coating, mold coating, print transfer, dipping and pulling, inkjet, spraying, and vacuum vapor deposition. An actually used method can be appropriately selected therefrom depending on the properties of a photoelectric conversion layer intended to be produced; i.e., in consideration of, for example, thickness control and orientation control.

For spin coating, for example, it is preferable to use a solution containing the organic materials at a concentration of 5 mg/mL or more but 40 mg/mL or less. Here, the concentration refers to the total mass of the organic materials relative to the volume of the solution containing the organic materials. In the above range of concentration, it is possible to easily form a homogeneous photoelectric conversion layer.

In order to remove the solvent or dispersion medium from the applied liquid containing the organic materials, an annealing treatment may be performed under reduced pressure or in an inert atmosphere (in a nitrogen or argon atmosphere). The temperature of the annealing treatment is preferably 40 degrees C. or higher but 300 degrees C. or lower and more preferably 50 degrees C. or higher but 150 degrees C. or lower. Performing the annealing treatment is preferable because the materials forming the layers can permeate each other at the interface between the stacked layers to have an increased contact area, which may be able to increase the short circuit current.

Examples of the solvent or dispersion medium for dissolving or dispersing the organic materials include, but are not limited to, methanol, ethanol, butanol, toluene, xylene, o-chlorophenol, acetone, ethyl acetate, ethylene glycol, tetrahydrofuran, dichloromethane, chloroform, dichloroethane, chlorobenzene, dichlorobenzene, trichlorobenzene, ortho-dichlorobenzene, chloronaphthalene, dimethylformamide, dimethyl sulfoxide, N-methylpyrrolidone, and γ-butyrolactone. These may be used alone or in combination. Of these, chlorobenzene, chloroform, and ortho-dichlorobenzene are particularly preferable. Various additives may be contained in the above solvent or dispersion medium. Examples of the various additives for use include, but are not limited to, diiodooctane and octanedithiol.

<Hole Transporting Layer>

The "hole transporting layer" is a layer configured to transport holes generated in the photoelectric conversion layer and prevent entry of electrons generated in the photoelectric conversion layer. In the configuration, one hole transporting layer may be present or two or more hole transporting layers may be present. As one example, the following is described about the configuration including one hole transporting layer.

The hole transporting layer is preferably a layer containing at least one selected from the group consisting of organic compounds having hole transportability and inorganic compounds having hole transportability. Examples of the organic compounds having hole transportability include, but are not limited to: conductive polymers such as polyethylenedioxythiophene:polystyrene sulfonic acid (PEDOT:PSS); and aromatic amine derivatives. Examples of the inorganic compounds having hole transportability include, but are not limited to, molybdenum oxide, tungsten oxide, vanadium oxide, nickel oxide, and copper(I) oxide. Of these compounds having hole transportability, molybdenum oxide, tungsten oxide, and vanadium oxide are preferable.

The average thickness of the hole transporting layer is preferably 200 nm or less and more preferably 1 nm or more but 50 nm or less.

Examples of a method for forming the hole transporting layer include, but are not limited to, a method of applying and then drying a liquid containing the compound having hole transportability and a solvent or dispersion medium. Examples of a method of applying the liquid include, but are not limited to, spin coating, the sol-gel method, slit die coating, and sputtering.

<Second Electrode>

The "second electrode" is an electrode configured to collect holes generated through photoelectric conversion. When the second electrode is provided on the light incident surface side, the second electrode is preferably high in light transmission and more preferably transparent from the viewpoint of increasing photoelectric conversion efficiency. When the second electrode is provided on the opposite side to the light incident surface, light transmission and transparency may be low.

The second electrode may be the same electrode as the above first electrode, and description therefor will be omitted.

<Surface Protection Portion>

The "surface protection portion (which may also be referred to as a "passivation layer" when it is in the form of a layer) is a member that is provided between the sealing member and the one electrode provided at a farther position from the light incident surface in the first electrode and the second electrode and that is configured to prevent direct contact between the one electrode and the sealing member. The shape of the surface protection portion is not particularly limited but is preferably in the form of a layer. The surface protection portion provided on the one electrode (specifically, the surface protection portion provided adjacent to a face of the one electrode where the face does not face the photoelectric conversion layer) can prevent contact of water or oxygen from the outside with the one electrode. This results in prevention of, for example, corrosion and deterioration which would otherwise occur on the one electrode over time, leading to increased durability during storage. The photoelectric conversion element is configured to prevent direct contact of an adhesive member forming the sealing member with the one electrode to prevent detachment of the electrode, which would otherwise occur due to transfer of the electrode-forming material to the side of the adhesive member.

Preferably, the surface protection portion entirely covers the exposed surface in the one electrode. When the exposed surface in the one electrode is entirely covered, the above functions of the surface protection portion increase more. The exposed surface in the one electrode specifically refers to, for example, a face and a side face of the one electrode that do not face the photoelectric conversion layer.

The material used for forming the surface protection portion is a compound derived from a fluorine-based silane compound (which may also be referred to as a "fluorine-containing silane compound"). In other words, a fluorine-based silane compound is used as the material for forming the surface protection portion. The fluorine-based silane compound is highly reactive with, for example, various metals or metal oxides that can form the one electrode, and is able to form a uniform, flat, thin-film surface protection portion on the one electrode. Such a thin-film surface protection portion that can be formed leads to an increase in flexibility of the surface protection portion. Even when the photoelectric conversion element is bent, breakage of the surface protection portion is prevented, resulting in prevention of detachment of the first electrode in the photoelectric conversion element and decrease in durability during storage. The surface protection portion containing the compound derived from the fluorine-based silane compound has high levels of water repellency, antifouling property, weatherability, and abrasion resistance. The fluorine-based silane compound is casy to handle, considering that it can be dissolved in use in a non-fluorine-based organic solvent rather than a fluorine-based organic solvent.

The fluorine-based silane compound is a fluorine-containing compound having an alkoxysilyl group. The alkoxysilyl group is not particularly limited as long as it is a group having a silicon atom and from 1 through 3 alkoxy groups bonded to the silicon atom. Examples of the alkoxy group include, but are not limited to, a methoxy group, an ethoxy group, and a propoxy group. The compound derived from the fluorine-based silane compound and contained in the surface protection portion may be chemically bonded to the one electrode through reaction of the fluorine-based silane compound with the one electrode, as described above. In other words, the surface protection portion is not limited to being an independent member that is not chemically bonded to the one electrode, but may be chemically bonded to the one electrode as long as the surface protection portion is functionally different from the one electrode. Preferably, the fluorine-based silane compound has a molecular weight of 1,000 or lower. When the molecular weight of the fluorine-based silane compound is 1,000 or lower, a thin surface protection portion having a small average thickness of 1 μm or less can be easily formed.

One preferable example of the fluorine-based silane compound used is a compound represented by General Formula (A) below. Use of the compound represented by the General Formula (A) can better prevent detachment of the electrode and decrease in durability during storage in the photoelectric conversion element.

[Chem. 18]

$$CF_3(CH_2)_q—O(CF_2CF_2O)_m(CF_2)_p(CH_2)_nSiR^1_{(3-a)}(OR^2)_a \quad \text{General Formula (A)}$$

In the General Formula (A), $R^1$ and $R^2$ each independently represent a monovalent hydrocarbon group having carbon atoms of 1 or more but 4 or less, a represents an integer of 2 or 3, p represents an integer of 1 or 2, q represents an integer of 0 or greater but 5 or smaller, m represents an integer of 1 or greater but 3 or smaller, n represents an integer of 2 or greater but 4 or smaller, and p+q+2m+n represents an integer of 5 or greater but 14 or smaller.

The average thickness of the surface protection portion is preferably 1 μm or less. The surface protection portion having an average thickness of 1 μm or less has increased flexibility. Even when the photoelectric conversion element is bent, breakage of the surface protection portion is prevented, resulting in prevention of detachment of the first electrode in the photoelectric conversion element and decrease in durability during storage. A method for measuring the average thickness of the surface protection portion is not particularly limited, and the average thickness thereof can be appropriately measured by a known method. Examples thereof include, but are not limited to, methods using a contact stylus profilometer, a white light interferometric microscope, and an atomic force microscope. The average thickness of the surface protection portion is an average value of the thicknesses that are measured at 5 or more different sites in the surface protection portion.

Conventionally, metal oxides such as SiOx, SiOxNy, and $Al_2O_3$, polymers such as polyethylene, fluorine-based coating agents, and poly-para-xylylene, etc. have been used as the material forming the surface protection portion. However, these conventional materials have difficulty in forming a thin surface protection portion due to process factors. Specifically, it is very difficult for the conventional materials to be formed into a film of 1 μm or less, and the resultant surface protection portion has insufficient flexibility. When a photoelectric conversion element having the surface protection portion formed with the conventional material is bent, cracks occur in the surface protection portion due to bending stress, and allow water and oxygen to enter therethrough, leading to a decrease in durability during storage. Meanwhile, use of the compound derived from the fluorine-based silane compound as the material forming the surface protection portion makes it easier to allow the average thickness of the surface protection portion to be 1 μm or less, leading to an increase in flexibility of the surface protection portion to increase durability during storage.

Examples of a method for producing the surface protection portion include, but are not limited to, hand painting, nozzle flow coating, dipping, spraying, reverse coating, flow coating, spin coating, and roll coating.

<Scaling Member>

The "sealing member" is a member that is provided adjacent to the surface protection portion and is configured to prevent entry of external substances such as water and oxygen into the photoelectric conversion element to contact each of the above layers. The sealing member preferably has a gas barrier member that prevents entry of external substances into the photoelectric conversion element and an adhesive member that adheres to the surface protection portion. The sealing member is more preferably a film member having these members that are combined together as one single member. When the sealing member is provided on the opposite side to the light incident surface, the scaling member may or may not have light transmittivity or transparency.

The function required for the gas barrier member is typically represented by, for example, a water vapor transmission rate or an oxygen transmission rate. Preferably, the water vapor transmission rate per day according to the method stipulated by JIS K7129 B is, for example, 10 $g/m^2$ or lower, and the lower it is, the more preferable. Preferably, the oxygen transmission rate per day according to the method stipulated by JIS K7126-2 is, for example, 1 $cm^3/m^2 \cdot atm$ or lower, and the lower it is, the more preferable.

Examples of the material of the gas barrier member include, but are not limited to, aluminum-coated resin films and silicon oxide-coated resin films.

The material of the adhesive member may be, for example, a typical material that is used for scaling of, for example, organic electroluminescence elements and organic transistors. Specific examples of the material of the adhesive member include, but are not limited to, pressure-sensitive adhesive resins, thermosetting resins, thermoplastic resins, and photocurable resins. Of these, pressure-sensitive adhesive resins are preferable because there is no need for heating at a sealing step. More specific examples thereof include, but are not limited to, ethylene-vinyl acetate copolymer resins, styrene-isobutylene resins, hydrocarbon-based resins, epoxy-based resins, polyester-based resins, acrylic-based resins, urethane-based resins, and silicone-based resins. By, for example, chemical modification of the main chain, branched chains, and terminals of these resins, and adjustment of molecular weights thereof, various adhesion properties can be obtained.

<UV Cut Layer>

The "UV cut layer" is a layer that is provided on the light incident surface side and configured to prevent degradation of the photoelectric conversion element due to UV light. The UV cut layer is preferably a film member that absorbs UV light. The UV cut layer is preferably provided on the base located on the light incident surface side.

The function required for the UV cut layer is typically represented by, for example, light transmittance. Preferably, the light transmittance of light having a wavelength of 370 nm or shorter is, for example, lower than 1%. Preferably, the light transmittance of light having a wavelength of 410 nm or shorter is, for example, lower than 1%.

<Gas Barrier Layer>

The "gas barrier layer" is a layer configured to prevent entry of external substances such as water and oxygen into the photoelectric conversion element. The gas barrier layer is preferably a continuous film. The gas barrier layer is preferably provided adjacent to the base and is more preferably provided between the other electrode and the base. In the present disclosure, when the gas barrier layer is provided adjacent to the base, the gas barrier layer is regarded as a constituent that constitutes the base.

The function required for the gas barrier layer is typically represented by, for example, a water vapor transmission rate or an oxygen transmission rate. Preferably, the water vapor transmission rate per day according to the method stipulated by JIS K7129 B is, for example, 10 $g/m^2$ or lower, and the lower it is, the more preferable. Preferably, the oxygen transmission rate per day according to the method stipulated by JIS K7126-2 is, for example, 1 $cm^3/m^2 \cdot atm$ or lower, and the lower it is, the more preferable.

Examples of the material of the gas barrier layer include, but are not limited to: materials containing $SiO_2$, SiNx, $Al_2O_3$, SiC, SiCN, SiOC, and SiOAl; and siloxane-based materials.

<Other Layers>

If necessary, the photoelectric conversion element may further include other layers such as an insulating porous layer, a degradation preventing layer, and a protection layer.

<Configuration of Photoelectric Conversion Element for Organic Thin-Film Solar Cell>

Figure 2:
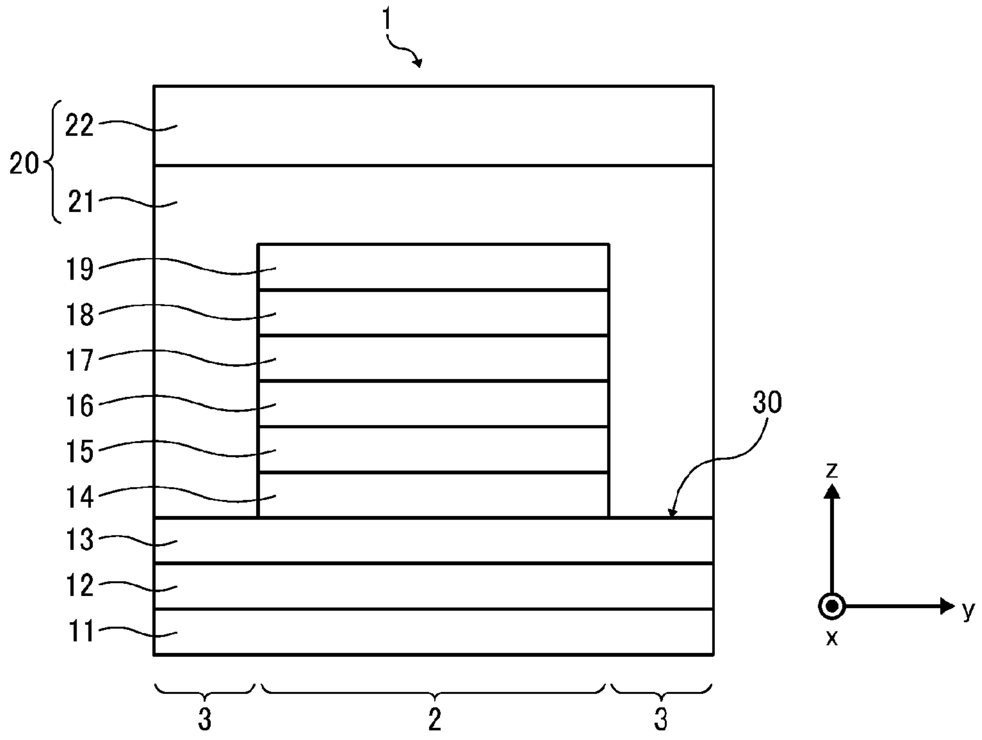
FIG. 2 is a schematic cross-sectional diagram illustrating one example of a photoelectric conversion element.

One example of the configuration of the photoelectric conversion element will be described with reference to FIGS. 1 and 2. FIG. 1 is a schematic diagram illustrating one example of the photoelectric conversion element as viewed from the above. FIG. 2 is a schematic cross-sectional diagram illustrating one example of the photoelectric conversion element.

As illustrated in the schematic diagram of FIG. 1, a photoelectric conversion element 1 includes a photoelectric conversion region 2 where photoelectric conversion is possible, a seal region 3 surrounding the photoelectric conversion region 2, and the other region 4 where the other members such as a terminal are provided.

As illustrated in the schematic cross-sectional diagram of FIG. 2, a photoelectric conversion element 1 has a configuration where a UV cut layer 11, a base 12, a first electrode 13, a first electron transporting layer 14, a second electron transporting layer (an intermediate layer) 15, a photoelectric conversion layer 16, a hole transporting layer 17, a second electrode 18, a surface protection portion (a passivation layer) 19, and a sealing member 20 are stacked in the photoelectric conversion region 2 along a stacking direction z in the order from the side of the light incident surface (hereinafter this structure may also be referred to as "Structure A"). In the seal region 3, the photoelectric conversion element 1 has the UV cut layer 11, the base 12, the first electrode 13, and the sealing member 20 that are stacked along the stacking direction z in the order from the side of the light incident surface. The sealing member 20 has an adhesive member 21 and a gas barrier member 22. Also, the sealing member 20 encloses the first electron transporting layer 14, the second electron transporting layer (the intermediate layer) 15, the photoelectric conversion layer 16, the hole transporting layer 17, the second electrode 18, and the surface protection portion (the passivation layer) 19 and adheres to the surface protection portion (the passivation layer) 19 and an adhesion region 30 in the first electrode 13. In the photoelectric conversion element 1, the first electrode 13 corresponds to the above "other electrode" and the second electrode 18 corresponds to the above "one electrode". The photoelectric conversion element 1 may further include, for example, a coupling portion in which the photoelectric conversion element 1 is electrically coupled to another photoelectric conversion element in series or in parallel. The stacking direction z is a direction perpendicular to the face of each layer (xy-plane) in the photoelectric conversion element.

In the photoelectric conversion region 2 of the photoelectric conversion element 1 having Structure A, the order in which from the first electrode 13 to the second electrode 18 are stacked is not limited to this order, as described above. Specifically, the photoelectric conversion element 1 may have a configuration where a UV cut layer 11, a base 12, a second electrode 13, a hole transporting layer 14, a photoelectric conversion layer 15, a second electron transporting layer (an intermediate layer) 16, a first electron transporting layer 17, a first electrode 18, a surface protection portion (a passivation layer) 19, and a sealing member 20 are stacked in the photoelectric conversion region 2 along a stacking direction z in the order from the side of the light incident surface (hereinafter this structure may also be referred to as "Structure B"). The sealing member 20 encloses the hole transporting layer 14, the photoelectric conversion layer 15, the second electron transporting layer (the intermediate layer) 16, the first electron transporting layer 17, the first electrode 18, the surface protection portion (the passivation layer) 19 and adheres to the surface protection portion (the passivation layer) 19 and an adhesion region 30 in the second electrode 13. In the photoelectric conversion element 1, the second electrode 13 corresponds to the above "other electrode" and the first electrode 18 corresponds to the above "one electrode". In the present disclosure, description will be mainly made taking as an example the photoelectric conversion element having the Structure A as illustrated in FIGS. 1 and 2. However, persons skilled in the art could easily understand from such descriptions the photoelectric conversion element having the Structure B.

<<Photoelectric Conversion Module for Organic Thin-Film Solar Cell>>

The "photoelectric conversion module" includes a plurality of photoelectric conversion elements that are electrically coupled to each other. Regarding the electrical coupling, the photoelectric conversion elements may be coupled in series or in parallel. The photoelectric conversion module may include both a plurality of photoelectric conversion elements that are electrically coupled in series and a plurality of photoelectric conversion elements that are electrically coupled in parallel. In the present disclosure, the "coupling" in each occurrence shall not be limited to a physical coupling and shall include an electrical coupling as well.

The photoelectric conversion module includes a plurality of photoelectric conversion elements and a coupling portion configured to electrically couple the plurality of photoelectric conversion elements to each other; and if necessary, includes other members. In other words, the photoelectric conversion module includes a first photoelectric conversion element, a second photoelectric conversion element adjacent to the first photoelectric conversion element, and a coupling portion configured to electrically couple the first photoelectric conversion element and the second photoelectric conversion element to each other; and if necessary, includes other members. The photoelectric conversion element and the coupling portion may be functionally distinguishable members. The photoelectric conversion element and the coupling portion may be independent members. Alternatively, the photoelectric conversion elements and the coupling portion may be a continuously or integrally provided member. For example, the electrode, as one constituting member of the photoelectric conversion element, and the coupling portion may be independent members or may be a continuously or integrally provided member.

<<Methods for Producing Photoelectric Conversion Element and Photoelectric Conversion Module for Organic Thin-Film Solar Cell>>

One example of a method for producing a photoelectric conversion module will be described while referring to one example of a method for producing a photoelectric conversion element. In the present disclosure, one example of a method for producing a photoelectric conversion element having the Structure A as illustrated in FIG. 2 will be described. However, persons skilled in the art could easily understand from the below-given description one example of a method for producing a photoelectric conversion element having the Structure B.

The method for producing the photoelectric conversion module including the photoelectric conversion element includes, for example: a gas barrier layer forming step of forming a gas barrier layer on a base; a first electrode forming step of forming a first electrode on the base including the gas barrier layer; an electron transporting layer forming step of forming an electron transporting layer on the first electrode; a photoelectric conversion layer forming step of forming a photoelectric conversion layer on the electron transporting layer; a penetrating portion forming step of forming a penetrating portion that penetrates the electron transporting layer and the photoelectric conversion layer; a hole transporting layer forming step of forming a hole transporting layer on the photoelectric conversion layer and coating exposed surfaces of the first electrode, the electron transporting layer, and the photoelectric conversion layer in the penetrating portion with a material of the hole transporting layer; a second electrode forming step of forming a second electrode on the hole transporting layer and filling the penetrating portion with a material of the second electrode to form a penetrating structure; a surface protection portion forming step of forming a surface protection portion on the second electrode; an adhesion region forming step of removing a peripheral portion of a stack of from the electron transporting layer to the surface protection portion, to form an adhesion region in the first electrode; and a sealing member forming step of allowing a sealing member to enclose the stack of from the electron transporting layer to the surface protection portion and contact the surface protection portion and the adhesion region. If necessary, the method includes, for example, a UV cut layer forming step and other steps.

<Gas Barrier Layer Forming Step>

The method for producing the photoelectric conversion module including the photoelectric conversion element preferably includes a gas barrier layer forming step of forming a gas barrier layer on a base. When the base itself has gas barrier property, formation of the gas barrier layer is optional.

<First Electrode Forming Step>

The method for producing the photoelectric conversion module including the photoelectric conversion element preferably includes a first electrode forming step of forming a first electrode on the base including the gas barrier layer. When the base does not include a gas barrier layer, the first electrode is may be formed on the base.

A method of forming the first electrode is as described in the description regarding the first electrode.

<Electron Transporting Layer Forming Step>

The method for producing the photoelectric conversion module including the photoelectric conversion element preferably includes an electron transporting layer forming step of forming an electron transporting layer on the first electrode. When a first electron transporting layer and a second electron transporting layer (an intermediate layer) are included as the electron transporting layer, the electron transporting layer forming step preferably includes a first electron transporting layer forming step of forming the first electron transporting layer on the first electrode and a second electron transporting layer forming step of forming the second electron transporting layer on the first electron transporting layer.

A method of forming the electron transporting layer is as described in the description regarding the electron transporting layer.

<Photoelectric Conversion Layer Forming Step>

The method for producing the photoelectric conversion module including the photoelectric conversion element preferably includes a photoelectric conversion layer forming step of forming a photoelectric conversion layer on the electron transporting layer.

A method of forming the photoelectric conversion layer is as described in the description regarding the photoelectric conversion layer.

<Penetrating Portion Forming Step>

The method for producing the photoelectric conversion module including the photoelectric conversion element preferably includes a penetrating portion forming step of forming a penetrating portion that penetrates the electron transporting layer and the photoelectric conversion layer. In the present disclosure, the penetrating portion is a vacant pore. In the photoelectric conversion element having the Structure A as illustrated in FIG. 2, the penetrating portion is a vacant pore that penetrates the electron transporting layer and the photoelectric conversion layer. The shape, size, etc. of the penetrating portion are not limited as long as the photoelectric conversion elements can be electrically coupled to each other. Examples of the shape thereof include, but are not limited to, shapes that become a line or circle when the plan view of the photoelectric conversion module is observed from the second electrode thereof. Further examples of the shape thereof include, but are not limited to, shapes that become a rectangle or square when the cross-section of the photoelectric conversion element is observed. The penetrating portion divides each of the layers to form a plurality of photoelectric conversion elements.

Examples of a method of forming the penetrating portion include, but are not limited to, laser deletion and mechanical scribing.

<Hole Transporting Layer Forming Step>

The method for producing the photoelectric conversion module including the photoelectric conversion element preferably includes a hole transporting layer forming step of forming a hole transporting layer on the photoelectric conversion layer and coating exposed surfaces of the first electrode, the electron transporting layer, and the photoelectric conversion layer in the penetrating portion a material of the hole transporting layer.

A method of forming the hole transporting layer is as described in the description regarding the hole transporting layer.

<Second Electrode Forming Step>

The method for producing the photoelectric conversion module including the photoelectric conversion element preferably includes a second electrode forming step of forming a second electrode on the hole transporting layer and filling the penetrating portion with a material of the second electrode to form a penetrating structure. In the present disclosure, the penetrating structure is a structure that fills the interior of the penetrating portion. In the photoelectric conversion module having the Structure A as illustrated in FIG. 2, the penetrating structure is a structure formed of the material of the hole transporting layer and the material of the second electrode. This penetrating structure functions as a coupling portion configured to couple the photoelectric conversion elements to each other.

A method for forming the second electrode is as described in the description regarding the second electrode.

<Surface Protection Portion Forming Step>

The method for producing the photoelectric conversion module including the photoelectric conversion element preferably includes a surface protection portion forming step of forming a surface protection portion on the second electrode.

A method for forming the surface protection portion is as described for the surface protection portion.

<Adhesion Region Forming Step>

The method for producing the photoelectric conversion module including the photoelectric conversion element preferably includes an adhesion region forming step of removing a peripheral portion of a stack of from the electron transporting layer to the surface protection portion (i.e., a stack of the electron transporting layer, the photoelectric conversion layer, the hole transporting layer, the second electrode, and the surface protection portion), to expose the first electrode to form an adhesion region on the first electrode.

Examples of a method for removing the peripheral portion include, but are not limited to, laser deletion and mechanical scribing.

<Sealing Member Forming Step>

The method for producing the photoelectric conversion module including the photoelectric conversion element may include a sealing member forming step of allowing a sealing member to enclose the stack of from the electron transporting layer to the surface protection portion (i.e., the stack of the electron transporting layer, the photoelectric conversion layer, the hole transporting layer, the second electrode, and the surface protection portion) and contact the surface protection portion and the adhesion region to adhere thereto. The sealing member forming step may be preformed by applying the adhesive member followed by attaching the gas barrier member on the adhesive member or by attaching the gas barrier member to which the adhesive member has been applied in advance.

The sealing member encloses the above stack in the photoelectric conversion element. As described in the present production method, a possible embodiment is that the sealing member enclosing the photoelectric conversion module results in enclosing the above stack. In other words, a possible embodiment is not limited to the embodiment where the above stack is enclosed in each photoelectric conversion element.

<UV Cut Layer Forming Step>

The method for producing the photoelectric conversion module including the photoelectric conversion element may, if necessary, include a UV cut layer forming step of forming a UV cut layer on the light incident surface side.

<Other Steps>

The method for producing the photoelectric conversion module including the photoelectric conversion element may, if necessary, include an insulating porous layer forming step, a degradation preventing layer forming step, and a protection layer forming step.

<Specific Examples of the Methods for Producing the Photoelectric Conversion Element and the Photoelectric Conversion Module for Organic Thin-Film Solar Cell>

Referring to FIG. 3A to FIG. 3M, one example of the method for producing the photoelectric conversion module including the photoelectric conversion element will be described in detail. FIG. 3A to FIG. 3M are schematic diagrams each illustrating the method for producing the photoelectric conversion module.

Figure 3A:
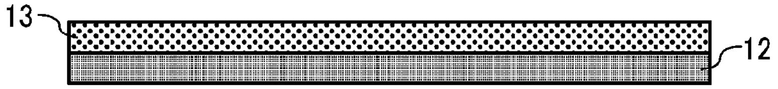
FIG. 3A is a schematic diagram illustrating one example of a method for producing a photoelectric conversion module.
Figure 3B:
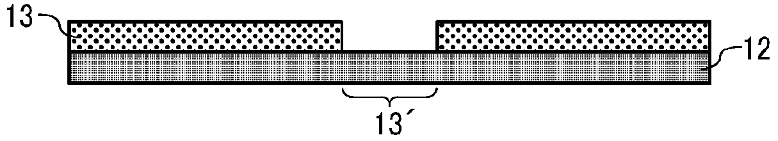
FIG. 3B is a schematic diagram illustrating one example of a method for producing a photoelectric conversion module.
Figure 3C:
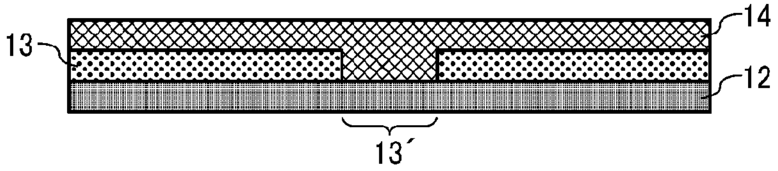
FIG. 3C is a schematic diagram illustrating one example of a method for producing a photoelectric conversion module.
Figure 3D:
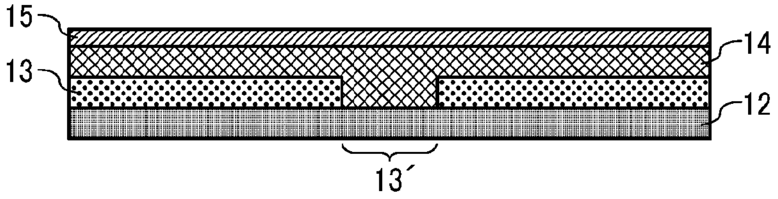
FIG. 3D is a schematic diagram illustrating one example of a method for producing a photoelectric conversion module.
Figure 3E:
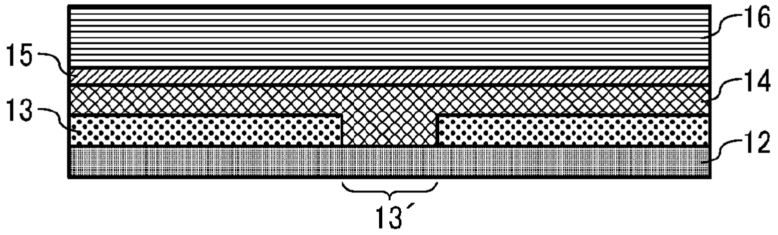
FIG. 3E is a schematic diagram illustrating one example of a method for producing a photoelectric conversion module.
Figure 3F:
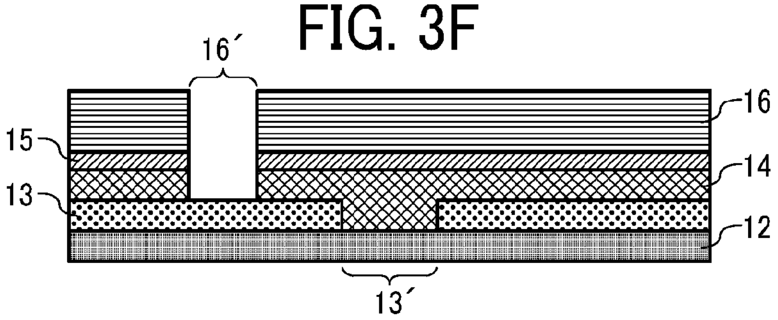
FIG. 3F is a schematic diagram illustrating one example of a method for producing a photoelectric conversion module.
Figure 3G:
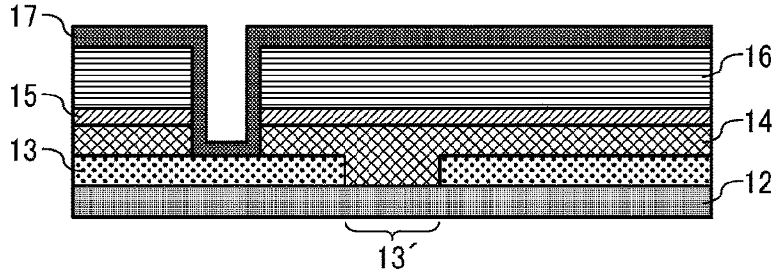
FIG. 3G is a schematic diagram illustrating one example of a method for producing a photoelectric conversion module.
Figure 3H:
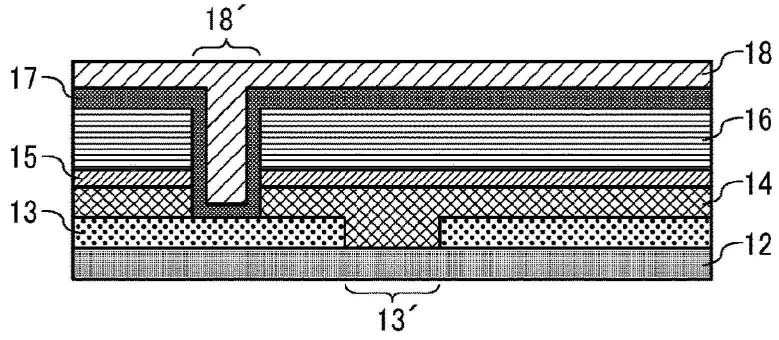
FIG. 3H is a schematic diagram illustrating one example of a method for producing a photoelectric conversion module.
Figure 3I:
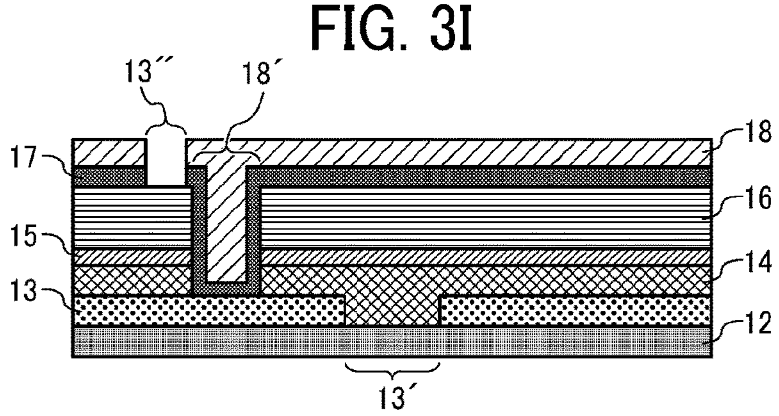
FIG. 3I is a schematic diagram illustrating one example of a method for producing a photoelectric conversion module.
Figure 3J:
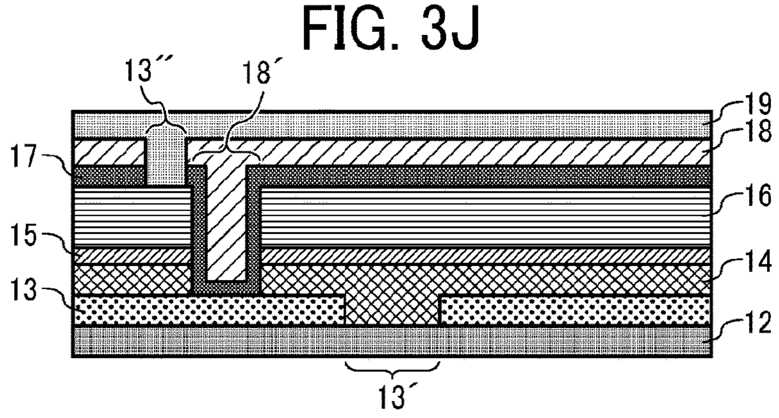
FIG. 3J is a schematic diagram illustrating one example of a method for producing a photoelectric conversion module.

As illustrated in FIG. 3A, first, a first electrode 13 (the other electrode) is formed on a base 12 having gas barrier property. When forming a plurality of photoelectric conversion elements on one base 12, as illustrated in FIG. 3B, part of the formed first electrode 13 is deleted to form a first partition portion 13'. The photoelectric conversion element formed on the left-hand side of the partition portion 13' is referred to as a first photoelectric conversion element, and the photoelectric conversion element formed on the right-hand side of the partition portion 13' is referred to as a second photoelectric conversion element. Next, as illustrated in FIG. 3C and FIG. 3D, a first electron transporting layer 14 is formed on the base 12 and the first electrode 13, and a second electron transporting layer (an intermediate layer) 15 is formed on the first electron transporting layer 14. Next, as illustrated in FIG. 3E, a photoelectric conversion layer 16 is formed on the formed second electron transporting layer 15. After the formation of the photoelectric conversion layer 16, as illustrated in FIG. 3F, a penetrating portion 16' is formed by removing a predetermined region so as to penetrate the first electron transporting layer 14 formed on the first electrode 13, the second electron transporting layer 15 formed on the first electron transporting layer 14, and the photoelectric conversion layer 16. After the formation of the penetrating portion 16', as illustrated in FIG. 3G and FIG. 3H, a hole transporting layer 17 and a second electrode 18 are formed. After the formation of the hole transporting layer 17 and the second electrode 18, a coupling portion 18' is formed that is a structure formed in the penetrating portion 16' of the material of the hole transporting layer and the material of the second electrode. When forming a plurality of photoelectric conversion elements on one base 12, as illustrated in FIG. 3I, between the second electrode 18 (the one electrode) in the first photoelectric conversion element and the second electrode 18 (the one electrode) in the second photoelectric conversion element, a predetermined region is removed so as to penetrate the second electrode 18 and the hole transporting layer 17, to form a second partition portion 13". Next, as illustrated in FIG. 3J, a surface protection portion 19 is formed on the second electrode 18. The formation of the surface protection portion 19 also forms a structure containing the material forming the surface protection portion in the second partition portion 13" (this structure is also regarded as one constituent of the partition portion). As illustrated in FIG. 3J, the above structure (partition portion) is continuous to each of the surface protection portions 19 in the first photoelectric conversion element and the second photoelectric conversion element. Also, as illustrated in FIG. 3J, the above structure (partition portion) is in contact with the side face of each of the second electrodes 18 (the one electrodes) in the first photoelectric conversion element and the second photoelectric conversion element, the side face of each of the hole transporting layers 17 in the first photoelectric conversion element and the second photoelectric conversion element, and the photoelectric conversion layer 16.

Figure 3K:
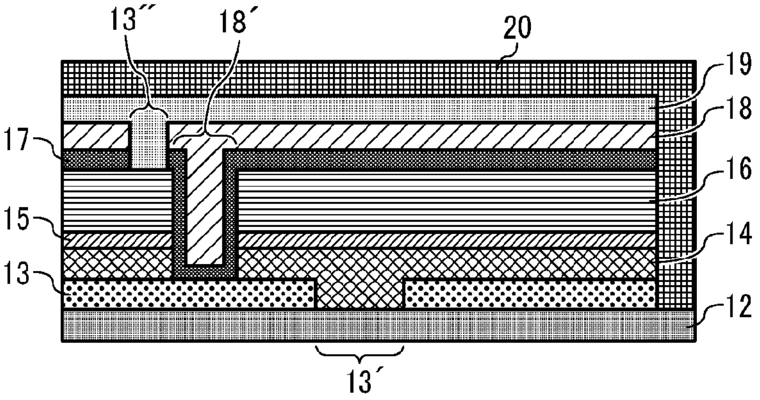
FIG. 3K is a schematic diagram illustrating one example of a method for producing a photoelectric conversion module.

The above structure (partition portion) of the same material as that forming the surface protection portion, which contacts and covers the above side faces and the photoelectric conversion layer, can prevent contact of water or oxygen from the outside with each of the layers such as the photoelectric conversion layer. This results in prevention of, for example, corrosion and deterioration which would otherwise occur on each of the layers such as the photoelectric conversion layer over time, leading to increased durability during storage. Next, as illustrated in FIG. 3K, the first electrode 13 is exposed by removing the peripheral portion in the stack of from the electron transporting layer 14 to the surface protection portion 19, to expose the first electrode 13 to form an adhesion region on the first electrode 13. Further, a scaling member 20 is allowed to enclose the stack of from the electron transporting layer to the surface protection portion and to contact the surface protection portion and the adhesion region to adhere thereto.

<<Photoelectric Conversion Element for Dye-Sensitized Solar Cell>>

As an example other than the photoelectric conversion element for the organic thin-film solar cell, a photoelectric conversion element for a dye-sensitized solar cell will be described. The photoelectric conversion element sequentially includes a first electrode, a photoelectric conversion layer, and a second electrode. The photoelectric conversion layer includes an electron transporting portion, a photosensitized compound, and a hole transporting portion. The photoelectric conversion element also includes a surface protection portion. The surface protection portion is provided adjacent to a face of one electrode selected from the first electrode and the second electrode where the face does not face the photoelectric conversion layer.

The photoelectric conversion element preferably includes a sealing member. The sealing member is provided adjacent to the surface protection portion and encloses the surface protection portion, the one electrode, and the photoelectric conversion layer.

If necessary, the photoelectric conversion element includes, for example, a base. The base is preferably provided adjacent to the other electrode at a side of a face of the other electrode where the face does not face the photoelectric conversion layer.

That is, the photoelectric conversion element has an exemplary configuration where the base, the first electrode, the photoelectric conversion layer, the second electrode, the surface protection portion, and the sealing member are sequentially stacked. In the following, each constituent will be described, but the base, the first electrode, the second electrode, the surface protection portion, and the sealing member will not be described because these constituents can be those in the configuration of the photoelectric conversion element for the organic thin-film solar cell.

<Photoelectric Conversion Layer>

The photoelectric conversion layer includes an electron transporting portion configured to transport electrons, a photosensitized compound configured to absorb light to generate charges, and a hole transporting portion configured to transport holes.

Electron Transporting Portion

The electron transporting portion is configured to transport electrons generated with the photosensitized compound.

The electron transporting portion includes an electron transporting material and if necessary includes other materials. The electron transporting material is not particularly limited and may be appropriately selected depending on the intended purpose, but a semiconductor material is preferable. The semiconductor material is in the form of particles, and preferably the particles are bonded together to form a porous film. The photosensitized compound is chemically or physically adsorbed on the surfaces of the semiconductor particles that form the porous electron transporting portion.

The semiconductor material is not particularly limited and may be a known one. Examples thereof include, but are not limited to, an element semiconductor, a compound semiconductor, and a compound having a perovskite structure.

Examples of the element semiconductor include, but are not limited to, silicon and germanium.

Examples of the compound semiconductor include, but are not limited to, chalcogenides of metals, specifically, oxides of, for example, titanium, tin, zinc, iron, tungsten, zirconium, hafnium, strontium, indium, cerium, yttrium, lanthanum, vanadium, niobium, and tantalum; sulfides of, for example, cadmium, zinc, lead, silver, antimony, and bismuth; selenides of, for example, cadmium and lead; and tellurides of, for example, cadmium. Examples of other compound semiconductors include, but are not limited to, phosphides of, for example, zinc, gallium, indium, and cadmium; gallium arsenide, copper-indium-selenide, and copper-indium-sulfide.

Examples of the compound having a perovskite structure include, but are not limited to, strontium titanate, calcium titanate, sodium titanate, barium titanate, and potassium niobate. Of these, oxide semiconductors are preferable, and in particular, titanium oxide, zinc oxide, tin oxide, and niobium oxide are more preferable. The electron transporting portion including titanium oxide as an electron transporting material exhibits a high conduction band to obtain a high open voltage. Also, this electron transporting portion has a high refractive index, and thus a high short-circuit current is achieved by virtue of the light confinement effect thereof.

Furthermore, the dielectric coefficient thereof is high and the mobility becomes higher, and a high fill factor can be obtained, which is advantageous.

These may be used alone or in combination. The crystal form of the semiconductor material is not particularly limited and may be appropriately selected depending on the intended purpose. The semiconductor material may be monocrystalline, polycrystalline, or amorphous.

The number average particle diameter of primary particles of the semiconductor material is not particularly limited and may be appropriately selected depending on the intended purpose. The number average particle diameter thereof is preferably 1 nm or more but 100 nm or less and more preferably 5 nm or more but 50 nm or less. A semiconductor material larger than the number average particle diameter may be mixed or stacked. This may be able to increase the conversion efficiency by virtue of the effect of scattering the incident light. The number average particle diameter in this case is preferably 50 nm or more but 500 nm or less.

The average thickness of the electron transporting portion is not particularly limited and may be appropriately selected depending on the intended purpose. The average thickness thereof is preferably 50 nm or more but 100 μm or less, more preferably 100 nm or more but 50 μm or less, and further preferably 120 nm or more but 10 μm or less. When the average thickness of the electron transporting portion is within the preferable range, a sufficient amount of the photosensitized compound per unit projection area can be secured. This can maintain a high light trapping rate, and also the diffusion distance of the injected electrons does not easily increase to be able to reduce the loss due to recombination of charges, which is advantageous.

Photosensitized Compound

The photosensitized compound is adsorbed on the surface of the semiconductor material that forms the electron transporting portion for further increasing the output and the photoelectric conversion efficiency.

The photosensitized compound is not particularly limited as long as it is a compound that is excited with light applied to the photoelectric conversion element, and may be appropriately selected depending on the intended purpose. Examples of the photosensitized compound include, but are not limited to, known metal complex compounds, a coumarin compound, a polyene compound, an indoline compound, and a thiophene compound.

The photosensitized compound is preferably at least one selected from the group consisting of compounds represented by General Formula (15) below and compounds represented by General Formula (16) below.

[Chem. 19]

General Formula (15)

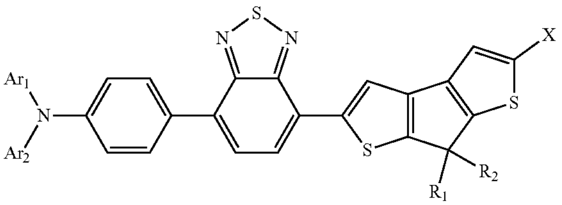

In the General Formula (15), $Ar_1$ and $Ar_2$ each independently represent an aryl group which may have a substituent. $R_1$ and $R_2$ each independently represent a straight-chain or branched alkyl group having from 4 through 10 carbon atoms. X represents any of the substituents represented by the structural formulae below.

[Chem. 20]

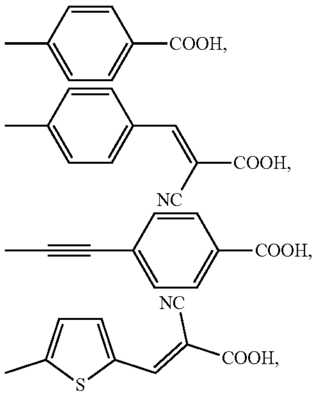

-continued

[Chem. 21]

General Formula (16)

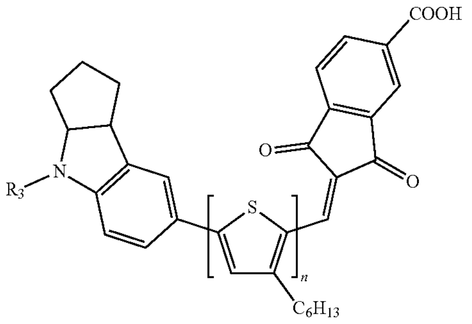

In the General Formula (16), n represents an integer of 0 or 1. $R_3$ represents an aryl group which may have a substituent, or any of the substituents represented by the structural formulae below.

[Chem. 22]

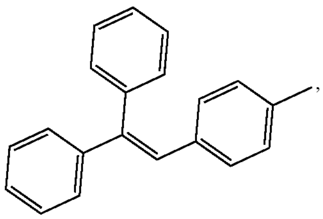

,

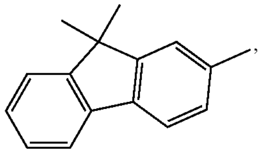

,

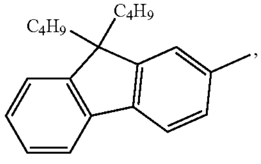

,

Of the photosensitized compounds represented by the General Formula (15), a compound represented by General Formula (17) below is further preferably used because high output can be obtained even with light of a low illuminance.

[Chem. 23]

Gnereal Formula (17)

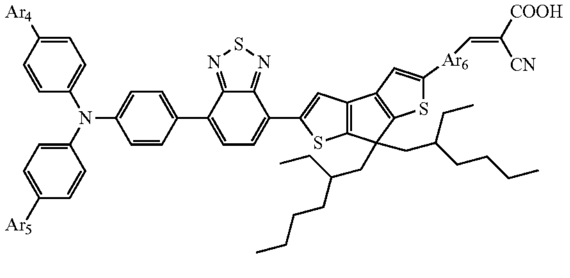

In the General Formula (17), $Ar_4$ and $Ar_5$ each independently represent a phenyl group which may have a substituent or a naphthyl group which may have a substituent. $Ar_6$ represents a phenyl group which may have a substituent or a thiophene group which may have a substituent.

Hole Transporting Portion

The hole transporting portion may be formed using any known material as long as the material has a function of transporting holes. Examples of the material include, but are not limited to, an electrolyte solution containing a redox pair dissolved in an organic solvent, a gel electrolyte that is a polymer matrix impregnated with an electrolyte solution containing a redox pair dissolved in an organic solvent, a molten salt containing a redox pair, a solid electrolyte, an inorganic hole transporting material, and an organic hole transporting material. Of these, an electrolyte solution or a gel electrolyte may be used, but a solid electrolyte is preferable and an organic hole transporting material is more preferable.

Examples of the organic hole transporting material include, but are not limited to, an oxadiazole compound, a triphenylmethane compound, a pyrazoline compound, a hydrazone compound, an oxadiazole compound, a tetraarylbenzidine compound, a stilbene compound, and a spiro compound. Of these, a spiro compound is more preferable.

For example, the spiro compound is preferably a compound represented by General Formula (18) below.

[Chem. 24]

General Formula (18)

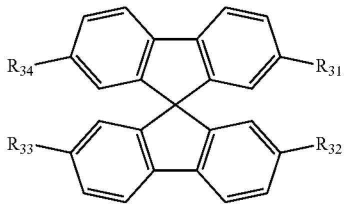

In the General Formula (18), $R_{31}$ to $R_{34}$ each independently represent a substituted amino group such as a dimethylamino group, a diphenylamino group, or a naphthyl-4-triamino group.

Preferably, the hole transporting layer further contains a lithium salt represented by General Formula (19) below.

[Chem. 25]

General Formula (19)

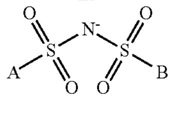

In the General Formula (19), A and B represent a substituent of F, $CF_3$, $C_2F_5$, $C_3F_7$, or $C_4F_9$ and A and B are different substituents.

Examples of the lithium salt include, but are not limited to, lithium (fluorosulfonyl)(trifluoromethanesulfonyl)imide (Li-FTFSI), lithium (fluorosulfonyl)(pentafluoroethanesulfonyl)imide (Li-FPFSI), lithium (fluorosulfonyl)(nonafluorobutanesulfonyl)imide (Li-FNFSI), lithium (nonafluorobutanesulfonyl)(trifluoromethanesulfonyl)imide (Li-NFTFSI), and lithium (pentafluoroethanesulfonyl)

(trifluoromethanesulfonyl)imide (Li-PFTFSI). Of these, lithium (fluorosulfonyl)(trifluoromethanesulfonyl)imide (Li-FTFSI) is particularly preferable.

<<Photoelectric Conversion Element for Perovskite Solar Cell>>

As an example other than the photoelectric conversion element for the organic thin-film solar cell, a photoelectric conversion element for a perovskite solar cell will be described. The photoelectric conversion element sequentially includes a first electrode, a photoelectric conversion layer, and a second electrode. Examples of the photoelectric conversion element having a configuration where other layers or members are inserted into between the electrodes and the layer include, but are not limited to, a photoelectric conversion element sequentially including a first electrode, an electron transporting layer, a photoelectric conversion layer, a hole transporting layer, and a second electrode.

The photoelectric conversion element also includes a surface protection portion. The surface protection portion is provided adjacent to a face of one electrode selected from the first electrode and the second electrode where the face does not face the photoelectric conversion layer.

The photoelectric conversion element preferably includes a sealing member. The sealing member is provided adjacent to the surface protection portion and encloses the surface protection portion, the one electrode, and the photoelectric conversion layer.

If necessary, the photoelectric conversion element includes, for example, a base. The base is preferably provided adjacent to the other electrode at a side of a face of the other electrode where the face does not face the photoelectric conversion layer.

That is, the photoelectric conversion element has an exemplary configuration where the base, the first electrode, the electron transporting layer, the photoelectric conversion layer, the hole transporting layer, the second electrode, the surface protection portion, and the sealing member are sequentially stacked. In the following, each constituent will be described, but the base, the first electrode, the second electrode, the surface protection portion, and the sealing member will not be described because these constituents can be those in the configuration of the photoelectric conversion element for the organic thin-film solar cell.

<Electron Transporting Layer>

The electron transporting layer is configured to transport electrons generated in the photoelectric conversion layer.

The electron transporting layer includes an electron transporting material. The electron transporting material is not particularly limited and may be appropriately selected depending on the intended purpose, but a semiconductor material is preferable. The semiconductor material is not particularly limited and may be a known one. Examples thereof include, but are not limited to, a compound containing an element semiconductor or a compound semiconductor.

Examples of the element semiconductor include, but are not limited to, silicon and germanium.

Examples of the compound semiconductor include, but are not limited to, chalcogenides of metals. Examples of the chalcogenides of metals include, but are not limited to, oxides of metals (oxide semiconductors), sulfides of metals, selenides of metals, and tellurides of metals. Examples of the oxides of metals (oxide semiconductors) include, but are not limited to, oxides of, for example, titanium, tin, zinc, iron, tungsten, zirconium, hafnium, strontium, indium, cerium, yttrium, lanthanum, vanadium, niobium, and tantalum. Examples of the sulfides of metals include, but are not limited to, sulfides of, for example, cadmium, zinc, lead, silver, antimony, and bismuth. Examples of the selenides of metals include, but are not limited to, selenides of, for example, cadmium and lead. Examples of the tellurides of metals include, but are not limited to, tellurides of, for example, cadmium. Examples of other compound semiconductors include, but are not limited to, phosphides of, for example, zinc, gallium, indium, and cadmium; gallium arsenide, copper-indium-selenide, and copper-indium-sulfide.

Of these, the oxides of metals (oxide semiconductors) are preferable. Among others, at least one selected from the group consisting of titanium oxide, zinc oxide, tin oxide, and niobium oxide is more preferably contained, and tin oxide is particularly preferably contained. These may be used alone or in combination. The crystal form of the semiconductor material is not particularly limited and may be appropriately selected depending on the intended purpose. The semiconductor material may be monocrystalline, polycrystalline, or amorphous.

<Photoelectric Conversion Layer>

The photoelectric conversion layer is a layer configured to perform photoelectric conversion and includes a perovskite layer containing a perovskite compound.

The perovskite compound is a composite material of an organic compound and an inorganic compound and is represented by General Formula (20) below.

[Chem. 26]

$$X_{\alpha}Y_{\beta}M_{\gamma} \quad \text{General Formula (20)}$$

In the General Formula (20), the proportion $\alpha:\beta:\gamma$ is 3:1:1 and $\beta$ and $\gamma$ represent an integer of 1 or greater. As one example, X may be a halogen ion, Y may be an ion of an organic compound having an amino group, and M may be a metal ion.

X in the General Formula (20) is not particularly limited and may be appropriately selected depending on the intended purpose. Examples thereof include, but are not limited to, ions of halogens such as chlorine, bromine, and iodine. These may be used alone or in combination.

Y in the General Formula (20) is, for example, an organic cation such as an ion of an alkylamine compound such as methylamine, ethylamine, n-butylamine, or formamidine; or an inorganic alkali metal cation such as an ion of cesium, potassium, or rubidium. These may be used alone or in combination. The inorganic alkali metal cation and the organic cation may be used in combination.

M in the General Formula (20) is not particularly limited and may be appropriately selected depending on the intended purpose. Examples thereof include, but are not limited to, ions of metals such as lead, indium, antimony, tin, copper, and bismuth. These may be used alone or in combination.

The perovskite layer preferably exhibits a layered perovskite structure where layers of a metal halide and layers of organic cation molecules arranged are alternatingly stacked.

<Hole Transporting Layer>

The hole transporting layer transports holes generated in the photoelectric conversion layer.

The hole transporting layer contains a hole transporting material. The hole transporting material is not particularly limited and may be appropriately selected depending on the intended purpose. For example, the hole transporting layer preferably contains a compound having a repeated structure represented by General Formula (21) below and a compound represented by General Formula (22).

[Chem. 27]

General Formula (21)

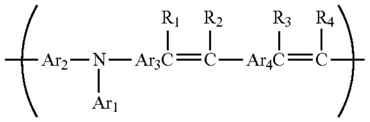

$Ar_1$ in the General Formula (21) represents an aryl group. Examples of the aryl group include, but are not limited to, a phenyl group, a 1-naphthyl group, and a 9-anthracenyl group. The aryl group may have a substituent. Examples of the substituent include, but are not limited to, an alkyl group, an alkoxy group, and an aryl group. $Ar_2$, $Ar_3$ and $Ar_4$ each independently represent, for example, an arylene group or a divalent heterocyclic group. Examples of the arylene group include, but are not limited to, 1,4-phenylene, 1,1'-biphenylene, and 9,9'-di-n-hexylfluorene. Examples of the divalent heterocyclic group include, but are not limited to, 2,5-thiophene. $R_1$ to $R_4$ each independently represent, for example, a hydrogen atom, an alkyl group, or an aryl group. Examples of the alkyl group include, but are not limited to, a methyl group and an ethyl group. Examples of the aryl group include, but are not limited to, a phenyl group and a 2-naphthyl group. The alkyl group and the aryl group may have a substituent.

[Chem. 28]

General Formula (22)

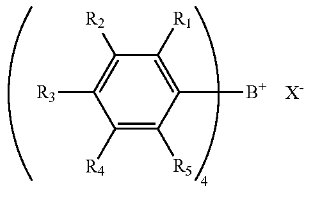

In the General Formula (22), $R_1$ to $R_5$ represent a hydrogen atom, a halogen atom, an alkyl group, an alkoxy group, or an aryl group, and may be identical or different. X represents a cation. $R_1$ and $R_2$, or $R_2$ and $R_3$ may be bonded together to form a ring structure.

Examples of the halogen atom include, but are not limited to, a chlorine atom, a bromine atom, and an iodine atom.

Examples of the alkyl group include, but are not limited to, alkyl groups having from 1 through 6 carbon atoms. The alkyl group may have a halogen atom as a substituent.

Examples of the alkoxy group include, but are not limited to, alkoxy groups having from 1 through 6 carbon atoms.

Examples of the aryl group include, but are not limited to, a phenyl group.

The cation is not particularly limited and may be appropriately selected depending on the intended purpose. Examples thereof include, but are not limited to, an alkali metal cation, a phosphonium cation, an iodonium cation, a nitrogen-containing cation, and a sulfonium cation. The nitrogen-containing cation refers to an ion having a cation on the nitrogen atom.

Examples thereof include, but are not limited to, an ammonium cation, a pyridinium cation, and an imidazolium cation.

Other hole transporting materials than the compound having the repeated structure represented by the General Formula (21) and the compound represented by the General Formula (22) are not particularly limited as long as they are materials having an ability to transport holes, and may be appropriately selected depending on the intended purpose. The other hole transporting materials are preferably organic compounds, and examples of the organic compounds include, but are not limited to, polymeric materials and low-molecular-weight materials given below.

The polymeric materials used in the hole transporting layer are not particularly limited and may be appropriately selected depending on the intended purpose. Examples thereof include, but are not limited to, a polythiophene compound, a polyphenylenevinylene compound, a polyfluorene compound, a polyphenylene compound, and a polythiadiazole compound. Examples of the polythiophene compound include, but are not limited to, poly(3-n-hexylthiophene), poly(3-n-octyloxythiophene), poly(9,9'-dioctyl-fluorene-co-bithiophene), poly(3,3'''-didodecyl-quarterthiophene), poly(3,6-dioctylthieno[3,2-b]thiophene), poly(2,5-bis(3-decylthiophen-2-yl)thieno[3,2-b]thiophene), poly(3,4-didecylthiophene-co-thieno[3,2-b]thiophene), poly(3,6-dioctylthieno[3,2-b]thiophene-co-thieno[3,2-b]thiophene), poly(3,6-dioctylthieno[3,2-b]thiophene-co-thiophene), and poly(3,6-dioctylthieno[3,2-b]thiophene-co-bithiophene).

Examples of the polyphenylenevinylene compound include, but are not limited to, poly[2-methoxy-5-(2-ethylhexyloxy)-1,4-phenylenevinylene], poly[2-methoxy-5-(3,7-dimethyloctyloxy)-1,4-phenylenevinylene], and poly[(2-methoxy-5-(2-ethylhexyloxy)-1,4-phenylenevinylene)-co-(4,4'-biphenylene-vinylene)].

Examples of the polyfluorene compound include, but are not limited to, poly(9,9'-didodecylfluorenyl-2,7-diyl), poly[(9,9-dioctyl-2,7-divinylenefluorene)-alt-co-(9,10-anthracene)], poly[(9,9-dioctyl-2,7-divinylenefluorene)-alt-co-(4,4'-biphenylene)], poly[(9,9-dioctyl-2,7-divinylenefluorene)-alt-co-(2-methoxy-5-(2-ethylhexyloxy)-1.4-phenylene)], and poly[(9,9-dioctyl-2,7-diyl)-co-(1,4-(2,5-dihexyloxy)benzene)].

Examples of the polyphenylene compound include, but are not limited to, poly[2,5-dioctyloxy-1,4-phenylene] and poly[2,5-di(2-ethylhexyloxy-1,4-phenylene].

Examples of the polythiadiazole compound include, but are not limited to, poly[(9,9-dioctylfluorenyl-2,7-diyl)-alt-co-(1,4-benzo(2,1',3)thiadiazole], and poly(3,4-didecylthiophene-co-(1,4-benzo(2,1',3)thiadiazole).

The low-molecular-weight materials used in the hole transporting layer are not particularly limited and may be appropriately selected depending on the intended purpose. Examples thereof include, but are not limited to, an oxadiazole compound, a triphenylmethane compound, a pyrazoline compound, a hydrazone compound, a tetraarylbenzidine compound, a stilbene compound, a spirobifluorene compound, and a thiophene oligomer.

<<Electronic Device>>

An electronic device includes the above photoelectric conversion element (which may be a photoelectric conversion module including a plurality of photoelectric conversion elements) and a device that is electrically coupled to the photoelectric conversion element. The device that is electrically coupled to the photoelectric conversion element is a device configured to be driven by, for example, electric power generated through photoelectric conversion of the photoelectric conversion element. The electronic device has two or more different embodiments depending on applications thereof. Examples of the embodiments include, but are not limited to, the following first and second embodiments.

The first embodiment is an electronic device including the photoelectric conversion element and the device that is electrically coupled to the photoelectric conversion element; and if necessary, including other devices.

The second embodiment is an electronic device including the photoelectric conversion element, a storage cell that is electrically coupled to the photoelectric conversion element, and a device that is electrically coupled to the photoelectric conversion element and the storage cell; and if necessary, including other devices.

<<Power Supply Module>>

A power supply module includes the above photoelectric conversion element and a power supply integrated circuit (IC) that is electrically coupled to the photoelectric conversion element; and if necessary, includes other devices.

<<Applications>>

The above photoelectric conversion element can function as a self-sustaining power supply and drive a device using electric power generated through photoelectric conversion. Since the photoelectric conversion element can generate electricity by irradiation with light, it is not necessary to couple an electronic device to an external power supply or replace a cell. The electronic device can be driven in a place where there is no power supply facility. The electronic device can be worn or carried. The electronic device can be driven without replacement of a cell even in a place where the cell is difficult to replace. When a dry cell is used in an electronic device, the electronic device becomes heavier by the weight of the dry cell, or the electronic device becomes larger by the size of the dry cell. There may be a problem in installing the electronic device on a wall or ceiling, or carrying the electronic device. However, since the photoelectric conversion element is lightweight and thin, it can be highly freely installed and be worn and carried, which is advantageous.

The photoelectric conversion element can be used as a self-sustaining power supply, and can be incorporated into various electronic devices in use. Examples of applications of the electronic devices that incorporate the photoelectric conversion element include, but are not limited to: display devices, such as electronic desk calculators, watches, mobile phones, electronic organizers, and electronic paper; accessory devices of personal computers, such as mice for personal computers or keyboards for personal computers; various sensor devices, such as temperature and humidity sensors and human detection sensors; transmitters, such as beacons or global positioning systems (GPSs); auxiliary lightings; and remote controllers.

The photoelectric conversion element of the present disclosure can generate electricity even with light of a low illuminance. The low illuminance is, for example, an illuminance as seen in an indoor environment irradiated with, for example, a lighting. Specifically, the low illuminance is an illuminance of 20 1× or higher but 1.000 1× or lower, and is much lower than direct sunlight (about 100,000 1×). The photoelectric conversion element has a wide variety of applications because it can generate electricity even in indoor environments and in further darker shaded areas. The photoelectric conversion element is highly safe because liquid leakage found in the case of a dry cell does not occur, and accidental swallowing found in the case of a button cell does not occur. The photoelectric conversion element can be used as an auxiliary power supply for the purpose of prolonging a continuous operation time of a charge-type or dry cell-type electrical appliance. When the photoelectric conversion element is combined with a device configured to be driven by electric power generated through photoelectric conversion of the photoelectric conversion element, it is possible to obtain an electronic device that is lightweight and easy to use, has a high degree of freedom in installation, does not require replacement, is excellent in safety, and is effective in reducing environmental load. The electronic device that incorporates the photoelectric conversion element can be used for a variety of applications.

Figure 4:
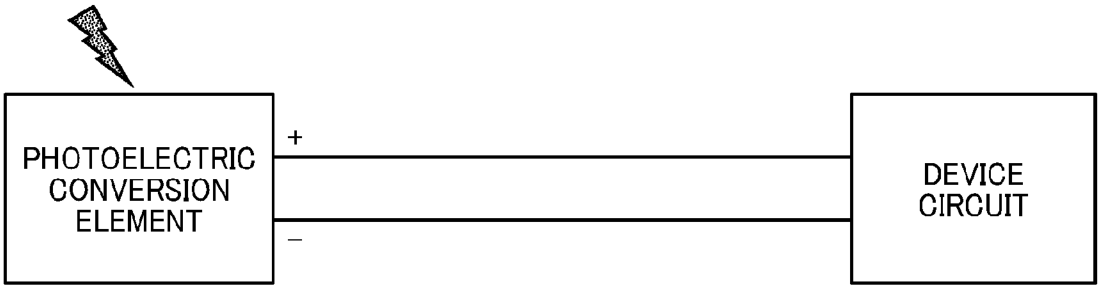
FIG. 4 is a schematic diagram illustrating one example of a basic configuration of an electronic device.

FIG. 4 is a schematic diagram illustrating one example of a basic configuration of the electronic device obtained by combining the photoelectric conversion element with the device that is configured to be driven by electric power generated through photoelectric conversion of the photoelectric conversion element. The electronic device can generate electricity when the photoelectric conversion element is irradiated with light, and electric power can be taken out. A circuit of the device can be driven by the generated electric power.

Figure 5:
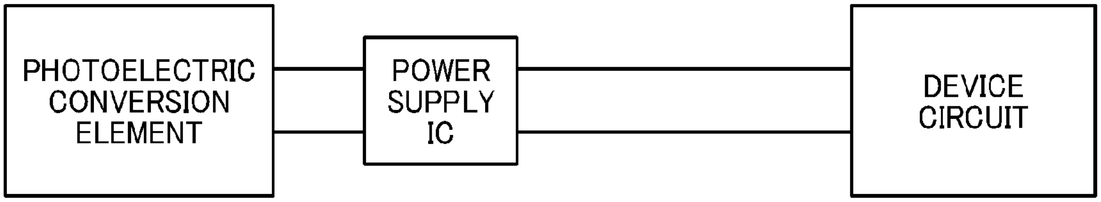
FIG. 5 is a schematic diagram illustrating one example of a basic configuration of an electronic device.

Since the output of the photoelectric conversion element varies depending on the illuminance of the surroundings, the electronic device illustrated in FIG. 4 cannot sometimes be stably driven. In this case, as illustrated in FIG. 5, which is a schematic diagram illustrating one example of a basic configuration of the electronic device, a power supply IC is preferably incorporated between the photoelectric conversion element and the circuit of the device to supply stable voltage to a side of the circuit of the device.

Figure 6:
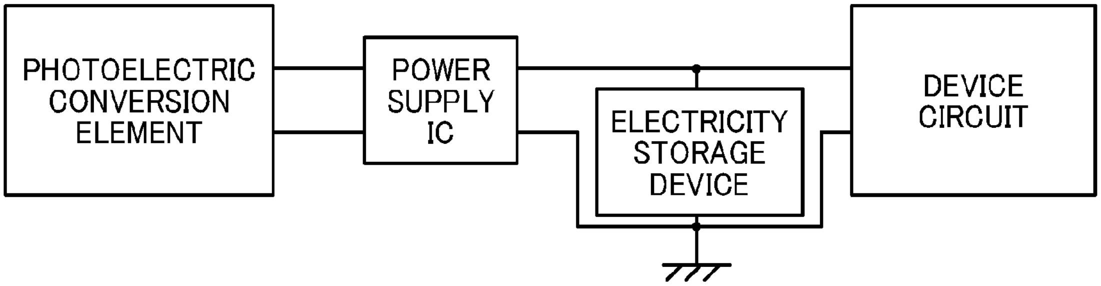
FIG. 6 is a schematic diagram illustrating one example of a basic configuration of an electronic device.

The photoelectric conversion element can generate electricity as long as the photoelectric conversion element is irradiated with light having a sufficient illuminance. However, when the illuminance is not enough to generate electricity, desired electric power cannot be obtained, which is a disadvantage of the photoelectric conversion element. In this case, as illustrated in FIG. 6, which is a schematic diagram illustrating one example of a basic configuration of the electronic device, when an electricity storage device such as a capacitor is provided between a power supply IC and a device circuit, excess electric power from the photoelectric conversion element can be charged to the electricity storage device. Even when the illuminance is too low or light is not applied to the photoelectric conversion element, the electric power stored in the electricity storage device can be supplied to a device circuit to allow for stable operation of the device circuit.

The electronic device obtained by combining the photoelectric conversion element with the device circuit can be driven even in an environment without a power supply, does not require replacement of a cell, and can be stably driven, when combined with a power supply IC or an electricity storage device. The electronic device that incorporates the photoelectric conversion element can be used for a variety of applications.

Figure 7:
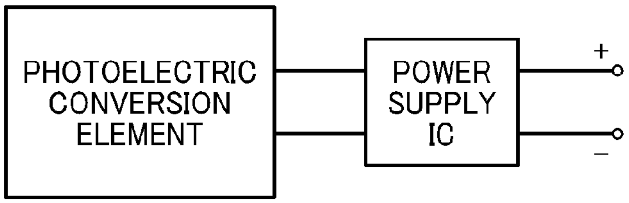
FIG. 7 is a schematic diagram illustrating one example of a basic configuration of a power supply module.

The photoelectric conversion element can also be used as a power supply module. As illustrated in FIG. 7, which is a schematic diagram illustrating one example of a basic configuration of a power supply module, for example, when the photoelectric conversion element and a power supply IC are coupled to each other, it is possible to configure a direct current power supply module, which is capable of supplying electric power generated through photoelectric conversion of the photoelectric conversion element to the power supply IC at a predetermined voltage level.

Figure 8:
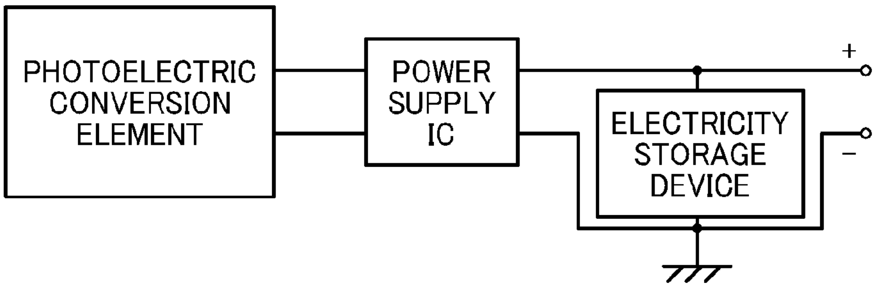
FIG. 8 is a schematic diagram illustrating one example of a basic configuration of a power supply module.

As illustrated in FIG. 8, which is a schematic diagram illustrating one example of a basic configuration of a power supply module, when an electricity storage device is added to a power supply IC, electric power generated by the photoelectric conversion element can be charged to the electricity storage device. It is possible to configure a power supply module capable of supplying electric power even when the illuminance is too low or light is not applied to the photoelectric conversion element.

The power supply modules illustrated in FIG. 7 and FIG. 8 can be used as a power supply module without replacement of a cell like in traditional primary cells. The electronic device that incorporates the photoelectric conversion element can be used for a variety of applications.

Now, specific applications of the electronic device including the above photoelectric conversion element and the device configured to be driven by electric power will be described.

<Application as Mouse for Personal Computer>

Figure 9:
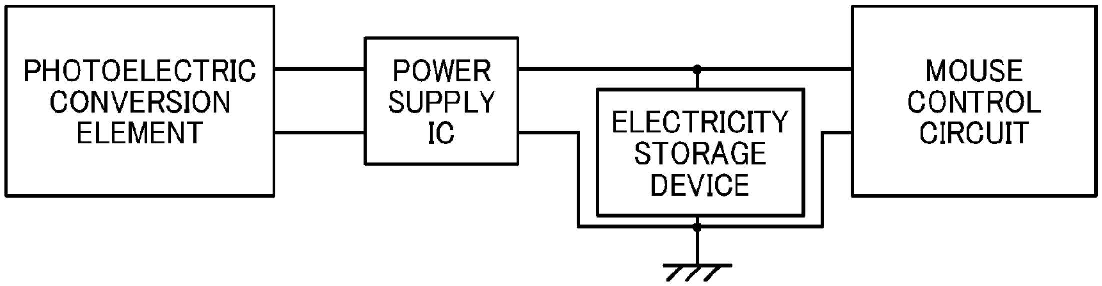
FIG. 9 is a schematic diagram illustrating one example of a basic configuration of a mouse for a personal computer.

FIG. 9 is a schematic diagram illustrating one example of a basic configuration of a mouse for a personal computer (hereinafter may also be referred to as a "mouse"). As illustrated in FIG. 9, the mouse includes the photoelectric conversion element, a power supply IC, an electricity storage device, and a mouse control circuit. As a power supply for the mouse control circuit, electric power is supplied from the coupled photoelectric conversion element or electricity storage device. With this configuration, electricity can be charged to the electricity storage device when the mouse is not used, and the mouse can be driven by the charged electric power. The mouse thus obtainable does not require any wiring or replacement of a cell. The mouse can become lightweight because a cell is not required. This is suitable as an application as a mouse.

Figure 10:
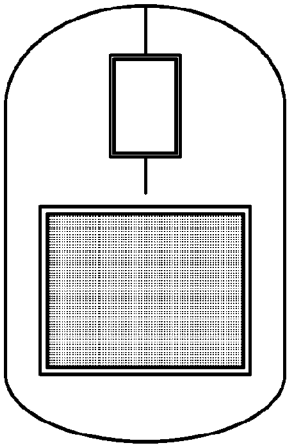
FIG. 10 is a schematic outside diagram illustrating one example of the mouse for a personal computer illustrated in FIG. 9.

FIG. 10 is a schematic outside diagram illustrating one example of the mouse for a personal computer illustrated in FIG. 9. As illustrated in FIG. 10, the photoelectric conversion element, the power supply IC, the electricity storage device, and the mouse control circuit are mounted inside the mouse. Meanwhile, the upper part of the photoelectric conversion element is covered with a transparent cover so that light hits the photoelectric conversion element. The whole casing of the mouse can also be shaped from a transparent resin. The arrangement of the photoelectric conversion element is not limited to this. For example, the photoelectric conversion element may be located anywhere as long as light hits the photoelectric conversion element even when the mouse is covered with a hand.

<Application as Keyboard for a Personal Computer>

Figure 11:
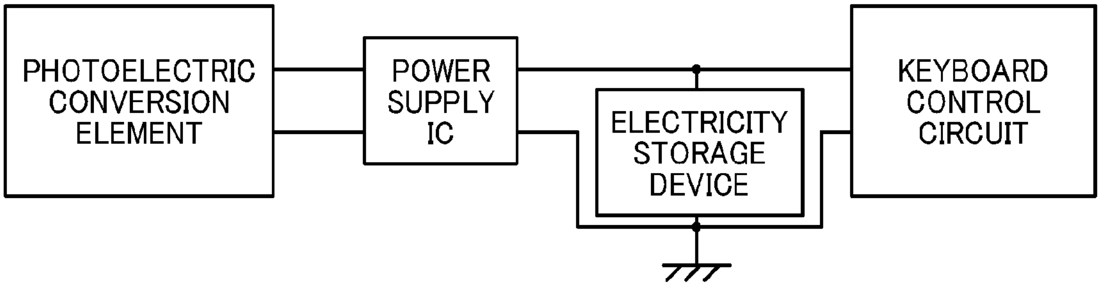
FIG. 11 is a schematic diagram illustrating one example of a basic configuration of a keyboard for a personal computer.

FIG. 11 is a schematic diagram illustrating one example of a basic configuration of a keyboard for a personal computer (hereinafter may also be referred to as a "keyboard"). As illustrated in FIG. 11, the keyboard includes the photoelectric conversion element, a power supply IC, an electricity storage device, and a keyboard control circuit. As a power supply for the keyboard control circuit, electric power is supplied from the coupled photoelectric conversion element or electricity storage device. With this configuration, electricity can be charged to the electricity storage device when the keyboard is not used, and the keyboard can be driven by the charged electric power. The keyboard thus obtainable does not require any wiring or replacement of a cell. The keyboard can become lightweight because a cell is not required. This is suitable as an application as a keyboard.

Figure 12:
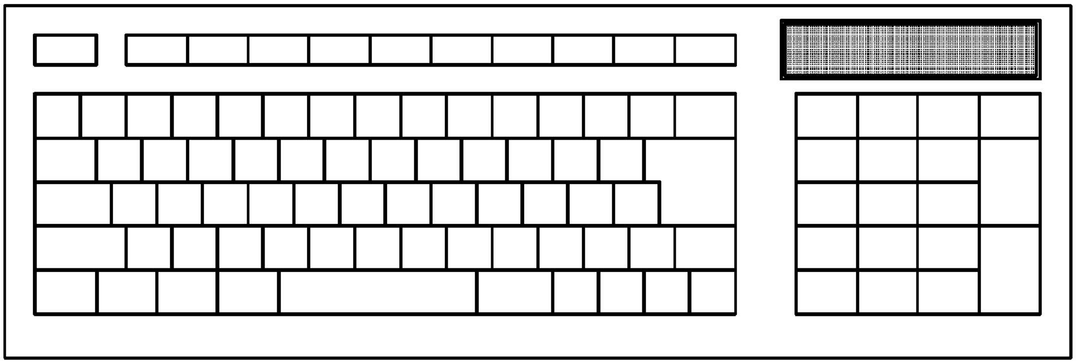
FIG. 12 is a schematic outside diagram illustrating one example of the keyboard for a personal computer illustrated in FIG. 11.
Figure 13:
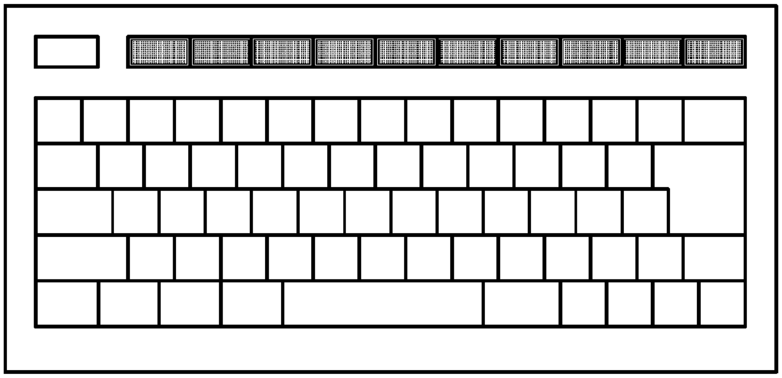
FIG. 13 is a schematic outside diagram illustrating another example of the keyboard for a personal computer illustrated in FIG. 11.

FIG. 12 is a schematic outside diagram illustrating one example of the keyboard for a personal computer illustrated in FIG. 11. As illustrated in FIG. 12, the photoelectric conversion element, the power supply IC, the electricity storage device, and the mouse control circuit are mounted inside the keyboard. Meanwhile, the upper part of the photoelectric conversion element is covered with a transparent cover so that light hits the photoelectric conversion element. The whole casing of the keyboard can also be shaped from a transparent resin. The arrangement of the photoelectric conversion element is not limited to this. For example, in the case of a compact keyboard with a small space for the photoelectric conversion element, as illustrated in FIG. 13, which is a schematic outside diagram illustrating another example of the keyboard for a personal computer illustrated in FIG. 11, a compact photoelectric conversion element can be embedded in parts of the keys.

<Application as Sensor>

Figure 14:
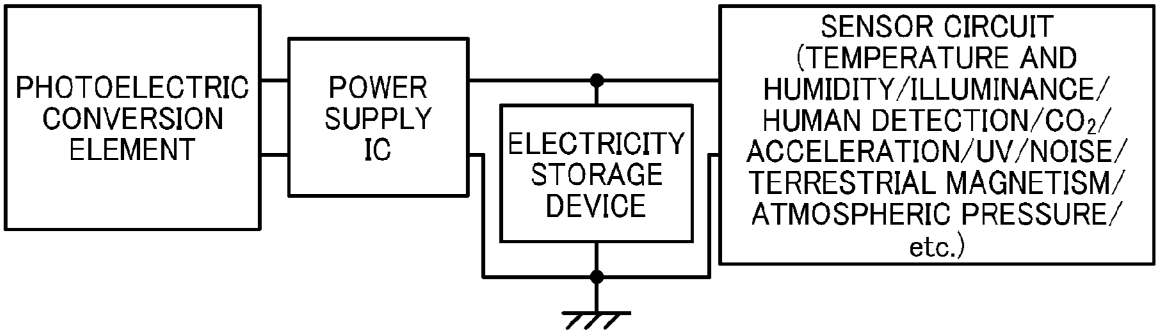
FIG. 14 is a schematic diagram illustrating one example of a basic configuration of a sensor.
Figure 15:
FIG. 15 is a schematic diagram illustrating one example of when data obtained through sensing with a sensor is transmitted to a personal computer, a smartphone, etc. via wireless communication.

FIG. 14 is a schematic diagram illustrating one example of a basic configuration of a sensor as one example of the electronic device. As illustrated in FIG. 14, the sensor includes the photoelectric conversion element, a power supply IC, an electricity storage device, and a sensor circuit. As a power supply for the sensor, electric power is supplied from the coupled photoelectric conversion element or electricity storage device. This makes it possible to configure a sensor that does not require coupling to an external power supply or replacement of a cell. Examples of a sensing target of the sensor include, but are not limited to, temperature and humidity, illuminance, human detection, $CO_2$, acceleration, UV, noise, terrestrial magnetism, and atmospheric pressure. As illustrated in "A" in FIG. 15, the sensor is preferably configured to sense a measurement target on a regular basis and to transmit the read data to, for example, a personal computer (PC) or a smartphone through wireless communication.

It is expected that use of sensors will be significantly increased in response to realization of the internet of things (IOT) society. Replacing cells of numerous sensors one by one takes a lot of effort and is not realistic. Sensors installed at positions where cells are not easy to replace, such as a ceiling and a wall, make workability low. The fact that electricity can be supplied by the photoelectric conversion element is significantly advantageous. The photoelectric conversion element of the present disclosure has such advantages that a high output can be obtained even with light of a low illuminance, and a high degree of freedom in installation can be achieved because dependency of the output on the light incident angle is small.

<Application as Turntable>

Figure 16:
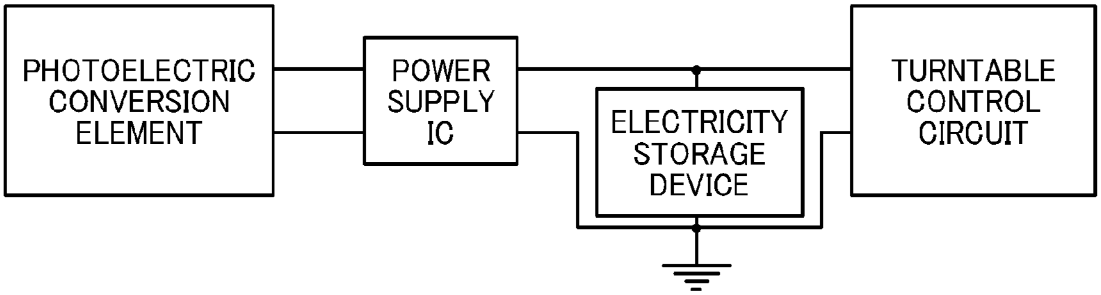
FIG. 16 is a schematic diagram illustrating one example of a basic configuration of a turntable.

FIG. 16 is a schematic diagram illustrating one example of a basic configuration of a turntable as one example of the electronic device. As illustrated in FIG. 16, the turntable includes the photoelectric conversion element, a power supply IC, an electricity storage device, and a turntable control circuit. As a power supply for the turntable control circuit, electric power is supplied from the coupled photoelectric conversion element or electricity storage device. This makes it possible to configure a turntable that does not require coupling to an external power supply or replacement of a cell. The turntable is used in, for example, a display case in which products are displayed. Wirings of a power supply degrade appearance of the display. Displayed products need removing when replacing a cell, which takes a lot of effort. The turntable to which electric power can be supplied by the photoelectric conversion element is significantly advantageous.

EXAMPLES

The present disclosure will be described below by way of Examples. However, the present disclosure should not be construed as being limited to the Examples.

Example 1

<Production of Photoelectric Conversion Module (Production of Organic Thin-Film Solar Cell)>

Base with First Electrode

First, a polyethylene terephthalate (PET) base (50 mm×50 mm) with a gas barrier layer having a patterned film of indium-doped tin oxide (ITO) was procured from GEOMATEC Co., Ltd. As illustrated in FIG. 3B, a first partition portion was formed in the first electrode. The thickness of the base was 50 μm and the water vapor transmission rate per day of the base was $3.0\times10^4$ g/m$^2$.

Formation of First Electron Transporting Layer

Next, a liquid of zinc oxide nanoparticles (obtained from Aldrich Co., average particle diameter: 12 nm) was spin-coated at 3,000 rpm on the ITO gas barrier PET film (15 Ω/sq.), followed by drying at 100° C. for 10 minutes, to form an electron transporting layer having an average thickness of 30 nm.

Formation of Second Electron Transporting Layer (Intermediate Layer)

Next, dimethylaminobenzoic acid (obtained from Tokyo Chemical Industry Co., Ltd.) was dissolved in ethanol to prepare a 1 mg/ml solution. The solution was spin-coated at 3,000 rpm on the first electron transporting layer, to form a second electron transporting layer having an average thickness of less than 10 nm.

Formation of Photoelectric Conversion Layer

Exemplary Compound 1 presented below (number average molecular weight (Mn)=1,554, highest occupied molecular orbital (HOMO) level: 5.13 eV) (12 mg), Exemplary Compound 2 presented below (PC61BM, obtained from Frontier Carbon Corporation) (10 mg), and Exemplary Compound 3 presented below (PTB7, obtained from Lumtec) were dissolved in 1 mL of chloroform, to prepare photoelectric conversion layer coating liquid A.

[Chem. 29]

Exemplary Compound 1

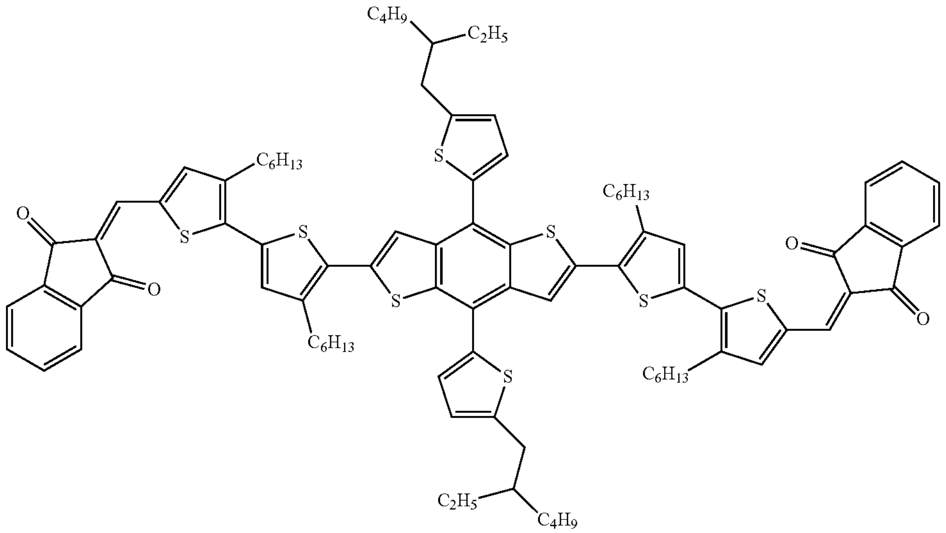

[Chem. 30]

Exemplary Compound 2

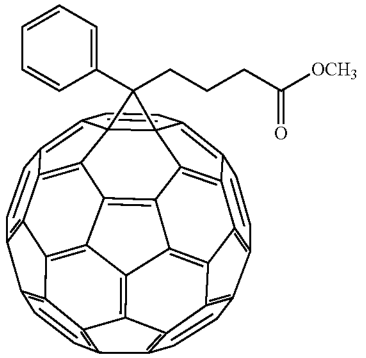

-continued

[Chem. 31]

Exemplary Compound 3

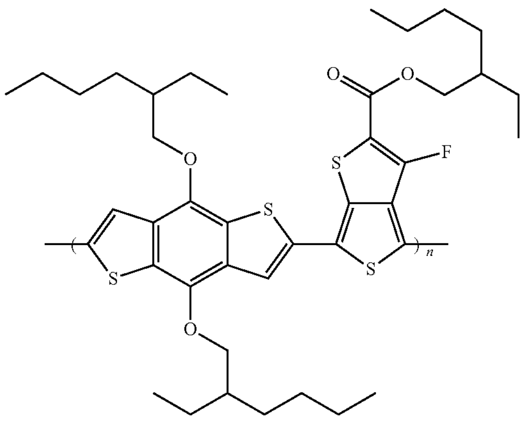

Next, the photoelectric conversion layer coating liquid A was spin-coated at 600 rpm on the intermediate layer, to form a photoelectric conversion layer having an average thickness of 200 nm.

Formulation of Penetrating Portion

Next, a penetrating portion was formed in a pre-step of forming a coupling portion, which was to couple photoelectric conversion elements in series. The penetrating portion was formed (by deletion) using laser deletion. The shape of the penetrating portion was a rectangle when the plan view of the photoelectric conversion module was observed from a second electrode thereof. The width of the penetrating portion was 0.12 mm. When the plan view of the photoelectric conversion module was observed from the second electrode thereof, the distance between the center of the penetrating portion and the center of the adjacent penetrating portion thereto was 5.6 mm.

Formation of Hole Transporting Layer, Second Electrode, and Coupling Portion

Next, the material of a hole transporting layer; i.e., molybdenum oxide (obtained from PURE CHEMICAL CO., LTD.) in an average thickness of 20 nm and the material of a second electrode; i.e., silver in an average thickness of 100 nm were sequentially vapor-deposited in vacuum on the photoelectric conversion layer and in the penetrating portion, to thereby form the hole transporting layer, the second electrode, and the coupling portion. As illustrated in FIG. 3I, a second partition portion was formed in the second electrode.

Formation of Surface Protection Portion

Next, the material of a surface protection portion; i.e., a fluorine-based silane compound (obtained from HARVES Co., Ltd., DURASURF DS-5935F130, a compound represented by General Formula (A)) was spin-coated on the second electrode, to form a surface protection portion having an average thickness of 50 nm. The surface protection portion formed entirely covered the exposed surface in the second electrode.

Formation of Sealing Member

An adhesive layer-attached sealing film having an aluminum PET base (obtained from tesa tape K.K.) was used as a scaling member to cover the photoelectric conversion module, followed by laminating using a laminator at a pressure of $5.0 \times 10^5$ Pa, a temperature of 70 degrees C., and a speed of 1.0 m/min. The water vapor transmission rate per day of the gas barrier member of the sealing member was 10 $g/m^2$ or less.

Evaluation of Solar Cell Characteristics

First, the photoelectric conversion element constituting the photoelectric conversion module formed was measured for current-voltage characteristics under white LED irradiation (color temperature: 5000 K, illuminance: 200 1x.). A current-voltage curve obtained was used to calculate photoelectric conversion efficiency. In the measurement, a white LED light used was a bulb-shaped LED lamp (LDA11N-G/100W, obtained from Toshiba Lighting & Technology Corporation) and an evaluation device (sourcemeter) used was KETSIGHT B2902A. Measurement of the output of the LED light source was made using spectrum color illumination meter C-7000 obtained from SEKONIC COPORATION.

Evaluation of Detachment of the Electrode

Using a desktop-type durability testing machine and a tension-free U-shape folding testing machine (DMX-FS) obtained from YUASA SYSTEM Co., Ltd., the photoelectric conversion module formed was subjected to a U-shape folding test 20 times at a bend radius of 15 mm with the light incident surface facing the outside.

Next, in the same manner as in the evaluation of solar cell characteristics before the U-shape folding test, the photoelectric conversion module having undergone the U-shape folding test was measured for current-voltage characteristics, and the photoelectric conversion efficiency thereof was calculated. The reduction rate of the photoelectric conversion efficiency between before and after the U-shape folding test was calculated, and results are presented in Table 1. When the photoelectric conversion module having undergone the U-shape folding test caused detachment of the electrode, the reduction rate of the photoelectric conversion efficiency between before and after the U-shape folding test was not calculated, and instead "Electrode detached" was described in Table 1. The reduction rate of the photoelectric conversion efficiency between before and after the U-shape folding test is determined from the formula: "the reduction rate of the photoelectric conversion efficiency between before and after the U-shape folding test={(the photoelectric conversion efficiency before the U-shape folding test−the photoelectric conversion efficiency after the U-shape folding test)/the photoelectric conversion efficiency before the U-shape folding test)}×100".

Evaluation of Durability During Storage Under Normal Temperature and Normal Humidity Using a desktop-type durability testing machine and a tension-free U-shape folding testing machine (DMX-FS) obtained from YUASA SYSTEM Co., Ltd., the photoelectric conversion module formed was subjected to a U-shape folding test 20 times at a bend radius of 15 mm with the light incident surface facing the outside.

Next, the photoelectric conversion module having undergone the U-shape folding test was left to stand still for 500 hours in a dark place at a normal temperature and a normal humidity (temperature: 25 degrees C., humidity: 30%).

Next, in the same manner as in the evaluation of solar cell characteristics before the U-shape folding test, the photoelectric conversion module having undergone the normal-temperature, normal-humidity storage test was measured for current-voltage characteristics, and the photoelectric conversion efficiency thereof was calculated.

The reduction rate of the photoelectric conversion efficiency between before and after the normal-temperature, normal-humidity storage test was calculated, and results are presented in Table 1. When the photoelectric conversion module having undergone the U-shape folding test caused detachment of the electrode, the reduction rate of the photoelectric conversion efficiency between before and after the U-shape folding test and the normal-temperature, normal-humidity storage test was not calculated, and instead "Electrode detached" was described in Table 1. The reduction rate of the photoelectric conversion efficiency between before and after the U-shape folding test and the normal-temperature, normal-humidity storage test is determined from the formula: "the reduction rate of the photoelectric conversion efficiency between before and after the U-shape folding test and the normal-temperature, normal-humidity storage test={(the photoelectric conversion efficiency between before the U-shape folding test and the normal-temperature, normal-humidity storage test−the photoelectric conversion efficiency between after the U-shape folding test and the normal-temperature, normal-humidity storage test)/the photoelectric conversion efficiency between before the U-shape folding test and the normal-temperature, normal-humidity storage test)}×100".

Evaluation of Durability During Storage Under High Temperature and High Humidity Using a desktop-type durability testing machine and a tension-free U-shape folding testing machine (DMX-FS) obtained from YUASA SYSTEM Co., Ltd., the photoelectric conversion module formed was subjected to a U-shape folding test 20 times at a bend radius of 15 mm with the light incident surface facing the outside.

Next, the photoelectric conversion module having undergone the U-shape folding test was left to stand still for 500 hours in a dark place at a high temperature and a high humidity (temperature: 85 degrees C. humidity: 85%).

Next, in the same manner as in the evaluation of solar cell characteristics before the U-shape folding test, the photoelectric conversion module having undergone the high-temperature, high-humidity storage test was measured for current-voltage characteristics, and the photoelectric conversion efficiency thereof was calculated. The reduction rate of the photoelectric conversion efficiency between before and after the high-temperature, high-humidity storage test was calculated, and results are presented in Table 1. When the photoelectric conversion module having undergone the U-shape folding test caused detachment of the electrode, the reduction rate of the photoelectric conversion efficiency between before and after the U-shape folding test and the high-temperature, high-humidity storage test was not calculated, and instead "Electrode detached" was described in Table 1. The reduction rate of the photoelectric conversion efficiency between before and after the U-shape folding test and the high-temperature, high-humidity storage test is determined from the formula: "the reduction rate of the photoelectric conversion efficiency between before and after the U-shape folding test and the high-temperature, high-humidity storage test={(the photoelectric conversion efficiency between before the U-shape folding test and the high-temperature, high-humidity storage test−the photoelectric conversion efficiency between after the U-shape folding test and the high-temperature, high-humidity storage test)/the photoelectric conversion efficiency between before the U-shape folding test and the high-temperature, high-humidity storage test)}×100".

Example 2

<Production of Photoelectric Conversion Module (Production of Organic Thin-Film Solar Cell)>

A photoelectric conversion module was produced in the same manner as in the production of the photoelectric conversion module of Example 1, except that the average thickness of the surface protection portion was changed to 250 nm.

In the same manner as in Example 1, the evaluation of solar cell characteristics was performed, and further the evaluation of detachment of the electrode, the evaluation of durability during storage under normal temperature and normal humidity, and the evaluation of durability during storage under high temperature and high humidity were performed. Results are presented in Table 1.

Example 3

<Production of Photoelectric Conversion Module (Production of Organic Thin-Film Solar Cell)>

A photoelectric conversion module was produced in the same manner as in the production of the photoelectric conversion module of Example 1, except that the average thickness of the surface protection portion was changed to 500 nm.

In the same manner as in Example 1, the evaluation of solar cell characteristics was performed, and further the evaluation of detachment of the electrode, the evaluation of durability during storage under normal temperature and normal humidity, and the evaluation of durability during storage under high temperature and high humidity were performed. Results are presented in Table 1.

Example 4

<Production of Photoelectric Conversion Module (Production of Organic Thin-Film Solar Cell)>

A photoelectric conversion module was produced in the same manner as in the production of the photoelectric conversion module of Example 1, except that the average thickness of the surface protection portion was changed to 750 nm.

In the same manner as in Example 1, the evaluation of solar cell characteristics was performed, and further the evaluation of detachment of the electrode, the evaluation of durability during storage under normal temperature and normal humidity, and the evaluation of durability during storage under high temperature and high humidity were performed. Results are presented in Table 1.

Example 5

<Production of Photoelectric Conversion Module (Production of Organic Thin-Film Solar Cell)>

A photoelectric conversion module was produced in the same manner as in the production of the photoelectric conversion module of Example 1, except that the photoelectric conversion layer coating liquid A was changed to photoelectric conversion layer coating liquid B prepared in the following manner.

In the same manner as in Example 1, the evaluation of solar cell characteristics was performed, and further the evaluation of detachment of the electrode, the evaluation of durability during storage under normal temperature and normal humidity, and the evaluation of durability during storage under high temperature and high humidity were performed. Results are presented in Table 1.

Photoelectric Conversion Layer Coating Liquid B

The above Exemplary Compound 1 (12 mg), the above Exemplary Compound 2 (10 mg), and the following Exemplary Compound 4 (PBDB-T, obtained from Brilliant Matters, number average molecular weight (Mn)=15,000, highest occupied molecular orbital (HOMO) level: 5.33 eV) (3 mg) were dissolved in 1 mL of chloroform, to prepare photoelectric conversion layer coating liquid B.

[Chem. 32]

Exemplary Compound 4

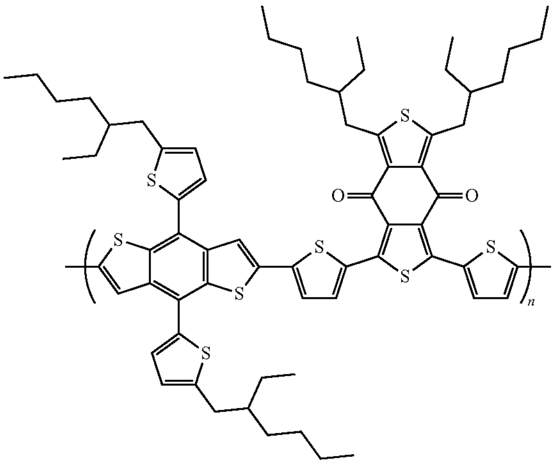

Example 6

<Production of Photoelectric Conversion Module (Production of Organic Thin-Film Solar Cell)>

A photoelectric conversion module was produced in the same manner as in the production of the photoelectric conversion module of Example 1, except that the photoelectric conversion layer coating liquid A was changed to photoelectric conversion layer coating liquid C prepared in the following manner.

In the same manner as in Example 1, the evaluation of solar cell characteristics was performed, and further the evaluation of detachment of the electrode, the evaluation of durability during storage under normal temperature and normal humidity, and the evaluation of durability during storage under high temperature and high humidity were performed. Results are presented in Table 1.

Photoelectric Conversion Layer Coating Liquid C

The following Exemplary Compound 5 (number average molecular weight (Mn)=1,886, highest occupied molecular orbital (HOMO) level: 5.00 eV) (12 mg), the above Exemplary Compound 2 (10 mg), and the above Exemplary Compound 4 (3 mg) were dissolved in 1 mL of chloroform, to prepare photoelectric conversion layer coating liquid C.

In the same manner as in Example 1, the evaluation of solar cell characteristics was performed, and further the evaluation of detachment of the electrode, the evaluation of durability during storage under normal temperature and normal humidity, and the evaluation of durability during storage under high temperature and high humidity were performed. Results are presented in Table 1.

[Chem. 33]

Exemplary Compound 5

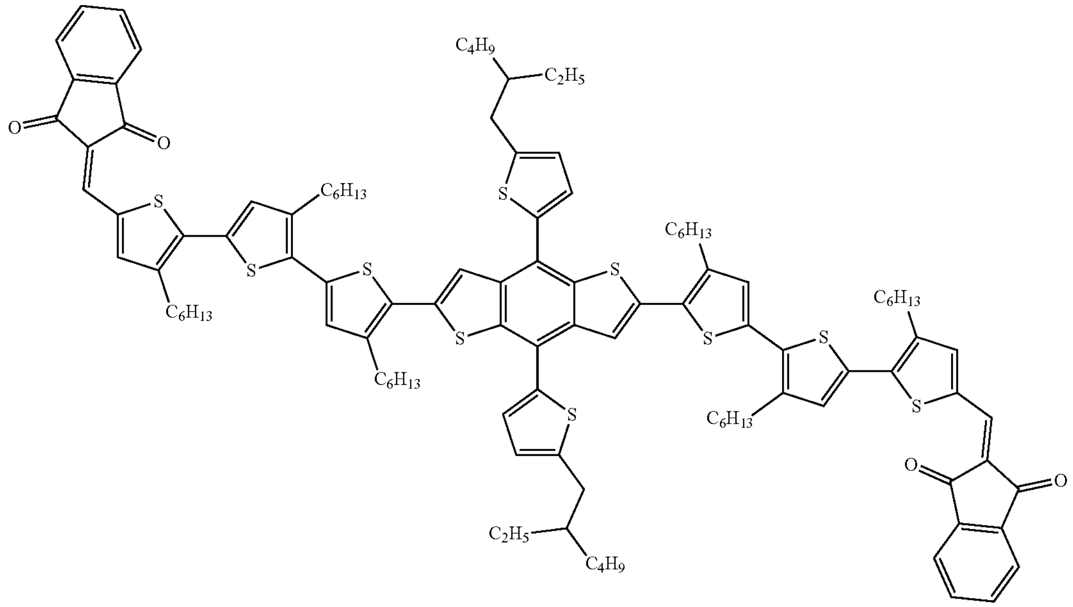

Example 7

<Production of Photoelectric Conversion Module (Production of Organic Thin-Film Solar Cell)>

A photoelectric conversion module was produced in the same manner as in the production of the photoelectric conversion module of Example 1, except that the photoelectric conversion layer coating liquid A was changed to photoelectric conversion layer coating liquid D prepared in the following manner.

Photoelectric Conversion Layer Coating Liquid D

The following Exemplary Compound 6 (number average molecular weight (Mn)=1,806, highest occupied molecular orbital (HOMO) level: 5.20 eV) (12 mg), the above Exemplary Compound 2 (10 mg), and the above Exemplary Compound 4 (3 mg) were dissolved in 1 mL of chloroform, to prepare photoelectric conversion layer coating liquid D.

[Chem. 34]

Exemplary Compound 6

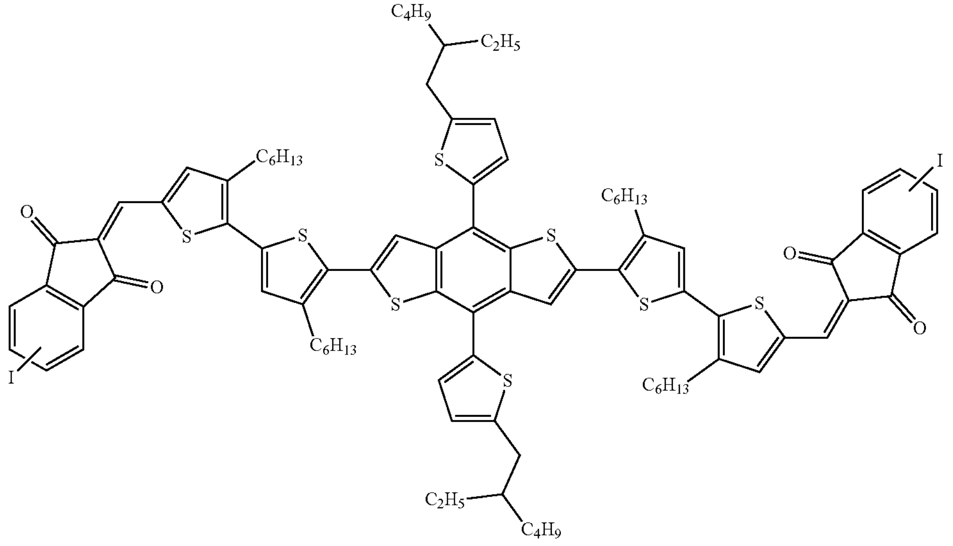

Example 8

<Production of Photoelectric Conversion Module (Production of Organic Thin-Film Solar Cell)>

A photoelectric conversion module was produced in the same manner as in the production of the photoelectric conversion module of Example 1, except that the photoelectric conversion layer coating liquid A was changed to photoelectric conversion layer coating liquid E prepared in the following manner.

In the same manner as in Example 1, the evaluation of solar cell characteristics was performed, and further the evaluation of detachment of the electrode, the evaluation of durability during storage under normal temperature and normal humidity, and the evaluation of durability during storage under high temperature and high humidity were performed. Results are presented in Table 1.

Photoelectric Conversion Layer Coating Liquid E

The above Exemplary Compound 1 (12 mg), the following Exemplary Compound 7 (PC71BM, obtained from Frontier Carbon Corporation) (10 mg), and the above Exemplary Compound 4 (3 mg) were dissolved in 1 mL of chloroform, to prepare photoelectric conversion layer coating liquid E.

[Chem. 35]

Exemplary Compound 7

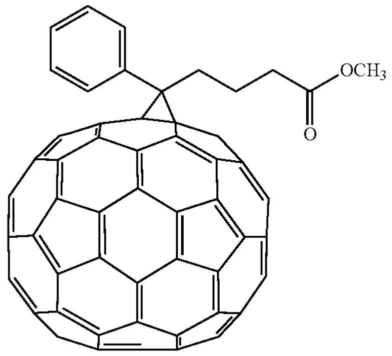

Example 9

<Production of Photoelectric Conversion Module (Production of Organic Thin-Film Solar Cell)>

A photoelectric conversion module was produced in the same manner as in the production of the photoelectric conversion module of Example 1, except that the photoelectric conversion layer coating liquid A was changed to photoelectric conversion layer coating liquid F prepared in the following manner.

In the same manner as in Example 1, the evaluation of solar cell characteristics was performed, and further the evaluation of detachment of the electrode, the evaluation of durability during storage under normal temperature and normal humidity, and the evaluation of durability during storage under high temperature and high humidity were performed. Results are presented in Table 1.

Photoelectric Conversion Layer Coating Liquid F

The above Exemplary Compound 1 (12 mg), the following Exemplary Compound 8 (PNP, obtained from HARVES Co., Ltd) (10 mg), and the above Exemplary Compound 4 (3 mg) were dissolved in 1 mL of chloroform, to prepare photoelectric conversion layer coating liquid F.

[Chem. 36]

Exemplary Compound 8

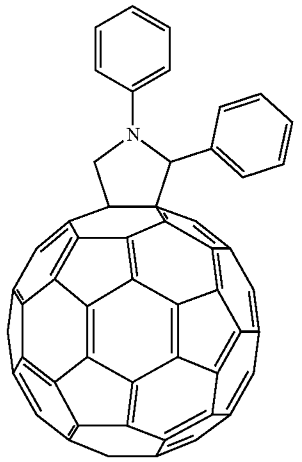

Example 10

<Production of Photoelectric Conversion Module (Production of Organic Thin-Film Solar Cell)>

A photoelectric conversion module was produced in the same manner as in the production of the photoelectric conversion module of Example 1, except that the photoelectric conversion layer coating liquid A was changed to photoelectric conversion layer coating liquid G prepared in the following manner.

In the same manner as in Example 1, the evaluation of solar cell characteristics was performed, and further the evaluation of detachment of the electrode, the evaluation of durability during storage under normal temperature and normal humidity, and the evaluation of durability during storage under high temperature and high humidity were performed. Results are presented in Table 1.

Photoelectric Conversion Layer Coating Liquid G

The following Exemplary Compound 9 (number average molecular weight (Mn)=1,463, highest occupied molecular orbital (HOMO) level: 5.27 eV) (12 mg), the above Exemplary Compound 2 (10 mg), and the above Exemplary Compound 4 (3 mg) were dissolved in 1 mL of chloroform, to prepare photoelectric conversion layer coating liquid G.

[Chem. 37]

Exemplary Compound 9

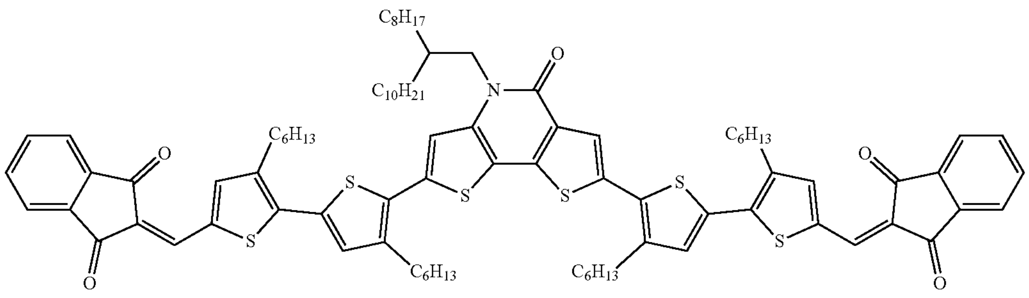

Example 11

<Production of Photoelectric Conversion Module (Production of Organic Thin-Film Solar Cell)>

A photoelectric conversion module was produced in the same manner as in the production of the photoelectric conversion module of Example 1, except that the photoelectric conversion layer coating liquid A was changed to photoelectric conversion layer coating liquid H prepared in the following manner.

In the same manner as in Example 1, the evaluation of solar cell characteristics was performed, and further the evaluation of detachment of the electrode, the evaluation of durability during storage under normal temperature and normal humidity, and the evaluation of durability during storage under high temperature and high humidity were performed. Results are presented in Table 1.

Photoelectric Conversion Layer Coating Liquid H

The following Exemplary Compound 10 (number average molecular weight (Mn)=2,029, highest occupied molecular orbital (HOMO) level: 5.50 eV) (12 mg), the above Exemplary Compound 2 (10 mg), and the above Exemplary Compound 4 (3 mg) were dissolved in 1 mL of chloroform, to prepare photoelectric conversion layer coating liquid H.

[Chem. 38]

Exemplary Compound 10

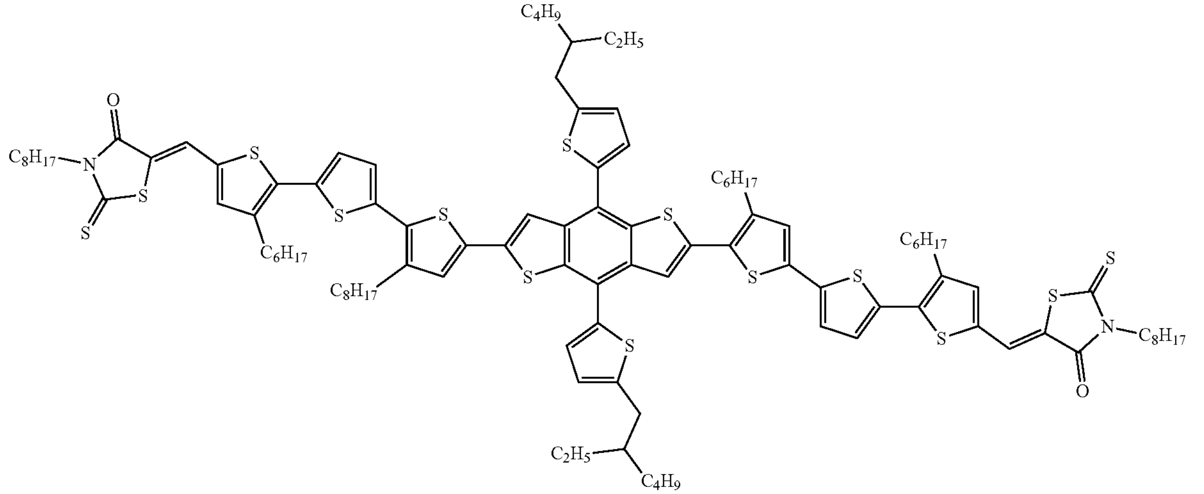

Example 12

<Production of Photoelectric Conversion Module (Production of Organic Thin-Film Solar Cell)>

A photoelectric conversion module was produced in the same manner as in the production of the photoelectric conversion module of Example 1, except that the base was changed to a flexible glass base (50 mm×50 mm) having a patterned film of indium-doped tin oxide (ITO). The thickness of the base was 50 μm and the water vapor transmission rate per day of the base was $3.0\times10^{-4}$ g/$m^2$.

In the same manner as in Example 1, the evaluation of solar cell characteristics was performed, and further the evaluation of detachment of the electrode, the evaluation of durability during storage under normal temperature and normal humidity, and the evaluation of durability during storage under high temperature and high humidity were performed. Results are presented in Table 1.

Example 13

<Production of Photoelectric Conversion Module (Production of Organic Thin-Film Solar Cell)>

A photoelectric conversion module was produced in the same manner as in the production of the photoelectric conversion module of Example 5, except that the base was changed to a flexible glass base (50 mm×50 mm) having a patterned film of indium-doped tin oxide (ITO). The thickness of the base was 50 μm and the water vapor transmission rate per day of the base was $3.0\times10^{-4}$ g/$m^2$.

In the same manner as in Example 1, the evaluation of solar cell characteristics was performed, and further the evaluation of detachment of the electrode, the evaluation of durability during storage under normal temperature and normal humidity, and the evaluation of durability during storage under high temperature and high humidity were performed. Results are presented in Table 1.

Example 14

<Production of Photoelectric Conversion Module (Production of Organic Thin-Film Solar Cell)>

A photoelectric conversion module was produced in the same manner as in the production of the photoelectric conversion module of Example 1, except that the material of the surface protection portion was changed to a fluorine-based silane compound (obtained from HARVES Co., Ltd., DURASURF DP-508C, a compound represented by General Formula (A)) and the average thickness of the surface protection portion to be formed was changed to 10 μm.

In the same manner as in Example 1, the evaluation of solar cell characteristics was performed, and further the evaluation of detachment of the electrode, the evaluation of durability during storage under normal temperature and normal humidity, and the evaluation of durability during storage under high temperature and high humidity were performed. Results are presented in Table 1.

Example 15

<Production of Photoelectric Conversion Module (Production of Organic Thin-Film Solar Cell)>

A photoelectric conversion module was produced in the same manner as in the production of the photoelectric conversion module of Example 5, except that the material of the surface protection portion was changed to a fluorine-based silane compound (obtained from HARVES Co., Ltd., DURASURF DP-508C, a compound represented by General Formula (A)) and the average thickness of the surface protection portion to be formed was changed to 10 μm.

In the same manner as in Example 1, the evaluation of solar cell characteristics was performed, and further the evaluation of detachment of the electrode, the evaluation of durability during storage under normal temperature and normal humidity, and the evaluation of durability during storage under high temperature and high humidity were performed. Results are presented in Table 1.

Example 16

<Production of Photoelectric Conversion Module (Production of Organic Thin-Film Solar Cell)>

A photoelectric conversion module was produced in the same manner as in the production of the photoelectric conversion module of Example 1, except that the photoelectric conversion layer coating liquid A was changed to photoelectric conversion layer coating liquid I prepared in the following manner.

In the same manner as in Example 1, the evaluation of solar cell characteristics was performed, and further the evaluation of detachment of the electrode, the evaluation of durability during storage under normal temperature and normal humidity, and the evaluation of durability during storage under high temperature and high humidity were performed. Results are presented in Table 1.

Photoelectric Conversion Layer Coating Liquid I

The above Exemplary Compound 1 (15 mg) and the above Exemplary Compound 2 (10 mg) were dissolved in 1 mL of chloroform, to prepare photoelectric conversion layer coating liquid I.

Example 17

<Production of Photoelectric Conversion Module (Production of Organic Thin-Film Solar Cell)>

A photoelectric conversion module was produced in the same manner as in the production of the photoelectric conversion module of Example 1, except that the photoelectric conversion layer coating liquid A was changed to photoelectric conversion layer coating liquid J prepared in the following manner.

In the same manner as in Example 1, the evaluation of solar cell characteristics was performed, and further the evaluation of detachment of the electrode, the evaluation of durability during storage under normal temperature and normal humidity, and the evaluation of durability during storage under high temperature and high humidity were performed. Results are presented in Table 1.

Photoelectric Conversion Layer Coating Liquid J

The above Exemplary Compound 9 (15 mg) and the above Exemplary Compound 2 (10 mg) were dissolved in 1 mL of chloroform, to prepare photoelectric conversion layer coating liquid J.

Example 18

<Production of Photoelectric Conversion Module (Production of Organic Thin-Film Solar Cell)>

A photoelectric conversion module was produced in the same manner as in the production of the photoelectric conversion module of Example 1, except that the photoelectric conversion layer coating liquid A was changed to photoelectric conversion layer coating liquid K prepared in the following manner.

In the same manner as in Example 1, the evaluation of solar cell characteristics was performed, and further the evaluation of detachment of the electrode, the evaluation of durability during storage under normal temperature and normal humidity, and the evaluation of durability during storage under high temperature and high humidity were performed. Results are presented in Table 1.

Photoelectric Conversion Layer Coating Liquid K

The above Exemplary Compound 10 (15 mg) and the above Exemplary Compound 2 (10 mg) were dissolved in 1 mL of chloroform, to prepare photoelectric conversion layer coating liquid K.

Example 19

<Production of Photoelectric Conversion Module (Production of Dye-Sensitized Solar Cell)>

An indium-doped tin oxide (ITO) and a niobium-doped tin oxide (NTO) were sequentially sputtered on a flexible glass base to form a film as a first electrode. Next, a dense layer (average thickness: 20 nm) of titanium oxide as a hole blocking layer was formed through reactive sputtering using oxygen gas.

Next, a paste of titanium oxide (obtained from Greatcell Solar Materials, 18NR-T) was applied through screen printing on the hole blocking layer so as to have an average thickness of about 1.3 μm. The resultant was dried at 120 degrees C. and then baked in the air at 550 degrees C. for 30 minutes, to form a porous electron transporting portion. After that, laser processing was performed to divide the ITO/NTO layer, the hole blocking layer, and the electron transporting portion into 8 cells.

Next, the glass base having the electron transporting portion formed was immersed in a solution that had been prepared by adding an acetonitrile/t-butanol (volume ratio: 1:1) liquid mixture to a photosensitized compound (0.2 mM) represented as Exemplary Compound 11, followed by stirring. The glass base immersed was left to stand still in a dark place for 1 hour to adsorb the photosensitized compound on the surface of the electron transporting portion. Next, a hole transporting portion coating liquid was prepared by dissolving, in a chlorobenzene solution, lithium bis(fluorosulfonyl)(trifluoromethanesulfonyl)imide (LiFTFSI) (obtained from Kishida Chemical Co., Ltd.) (70.2 mM), a pyridine compound represented as Exemplary Compound 12 (145.8 mM), an organic hole transporting material (HTM) (SHT-263, obtained from Merck) represented as Exemplary Compound 13 (162.0 mM), and a cobalt complex represented as Exemplary Compound 14 (obtained from Greatcell solar materials) (12.6 mM). The molar ratio (A/B) of the pyridine compound (A) to the lithium salt (B) was 2.08.

Next, the hole transporting portion coating liquid was used to form a hole transporting portion of about 550 nm through die coating on the electron transporting portion having the photosensitized compound adsorbed. After that, the end portion of the glass base to be provided with a sealing member was etched through laser processing, followed by performing additional laser processing to form a through hole for coupling to the ITO/NTO layer to serve as a portion from which a terminal would be taken out. Moreover, laser processing was performed to form a through hole for coupling the cells in series.

Next, a mask was disposed on the end portion of the flexible glass base and between the cells, followed by vapor-depositing silver in vacuum, to form a second electrode of about 70 nm. Next, the material of a surface protection portion; i.e., a fluorine-based silane compound (obtained from HARVES Co., Ltd., DURASURF DS-5935F130, a compound represented by General Formula (A)) was spin-coated on the second electrode, to form a surface protection portion having an average thickness of 50 nm. The surface protection portion formed entirely covered the exposed surface in the second electrode.

Next, an adhesive layer-attached sealing film having an aluminum PET base (obtained from tesa tape K.K.) was used as a scaling member to cover the photoelectric conversion module, followed by laminating using a laminator at a pressure of $5.0\times10^5$ Pa, a temperature of 70 degrees C., and a speed of 1.0 m/min. The water vapor transmission rate per day of the gas barrier member of the sealing member was 10 $g/m^2$ or less.

In the same manner as in Example 1, the evaluation of solar cell characteristics was performed, and further the evaluation of detachment of the electrode, the evaluation of durability during storage under normal temperature and normal humidity, and the evaluation of durability during storage under high temperature and high humidity were performed. Results are presented in Table 1.

[Chem. 39]

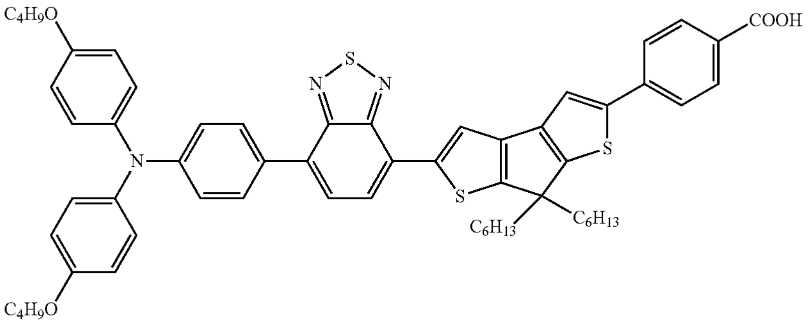

Exemplary Compound 11

[Chem. 40]

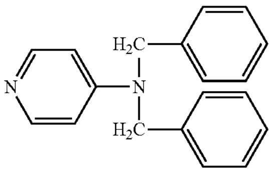

Exemplary Compound 12

[Chem. 41]

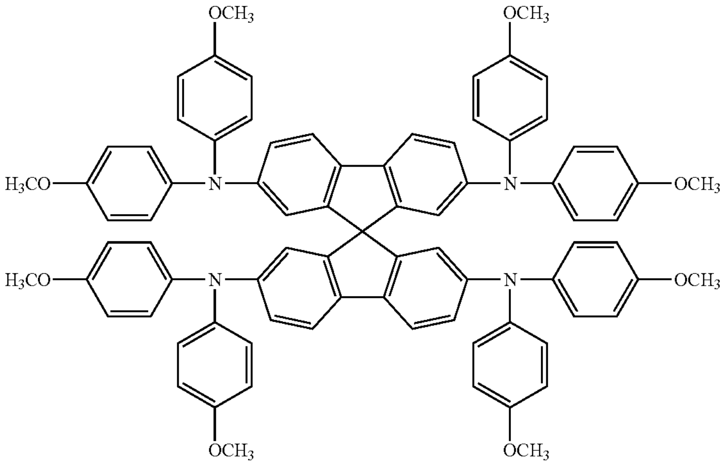

Exemplary Compound 13

-continued

[Chem. 42]

Exemplary Compound 14

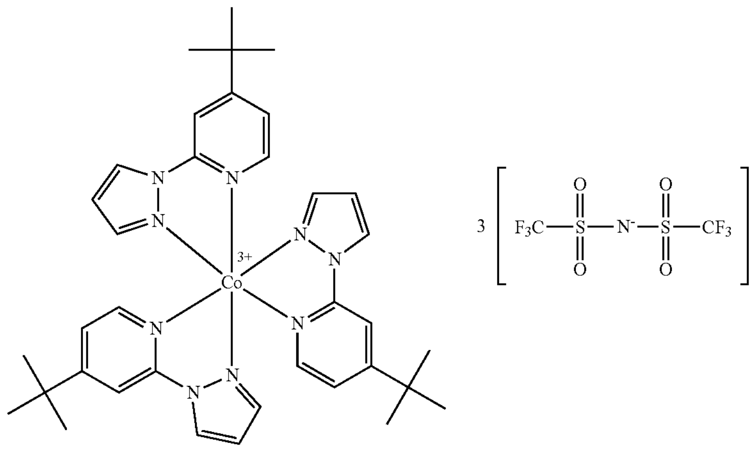

Example 20

<Production of Photoelectric Conversion Module (Production of Perovskite Solar Cell)>

First, a titaniumdiisopropoxide bis(acetylacetone)isopropylalcohol solution (obtained from Tokyo Chemical Industry Co. Ltd., B3395, 75% by mass) (0.36 g) was dissolved in 10 mL of isopropyl alcohol. The resultant solution was spin-coated on a FTO flexible glass base obtained from Nippon Sheet Glass Company, Ltd., followed by drying at 120 degrees C. for 3 minutes and then baking at 450 degrees C. for 30 minutes, to form a first electrode and a dense electron transporting layer (a dense layer) on the base. The dense layer was formed so as to have an average thickness of from 10 μm through 40 μm.

Next, a titanium oxide paste (obtained from Greatcell Solar, product name: MPT-20) was diluted with α-terpincol (obtained from KANTO CHEMICAL CO., INC.) and the resultant dispersion liquid was spin-coated on the dense layer, followed by drying at 120 degrees C. for 3 minutes and then baking at 550 degrees C. for 30 minutes.

Subsequently, lithium bis(trifluoromethanesulfonyl)imide (obtained from KANTO CHEMICAL CO., INC., product number: 38103) was dissolved in acetonitrile (obtained from KANTO CHEMICAL CO., INC.) to prepare a 0.1 M (where M means mol/$dm^3$) solution. The prepared solution was spin-coated on the above film, followed by baking at 450 degrees C. for 30 minutes, to form a porous electron transporting layer (a porous layer). The porous layer was formed so as to have an average thickness of 150 nm.

Then, lead(II) iodide (obtained from Tokyo Chemical Industry Co., Ltd., L0279, 0.5306 g), lead(II) bromide (obtained from Tokyo Chemical Industry Co., Ltd., L0288, 0.0736 g), methylamine bromide (obtained from Tokyo Chemical Industry Co., Ltd., M2589, 0.0224 g), formamidine iodide(obtained from Tokyo Chemical Industry Co., Ltd., F0974, 0.1876 g), and potassium iodide (obtained from KANTO CHEMICAL CO., INC., 32351, 0.0112 g) were added to N,N-dimethylformamide (obtained from KANTO CHEMICAL CO., INC., 0.8 ml) and dimethyl sulfoxide (obtained from KANTO CHEMICAL CO., INC., 0.2 ml), followed by stirring under heating at 60 degrees C. The resultant solution was spin-coated on the above porous layer while adding chlorobenzene (obtained from KANTO CHEMICAL CO., INC., 0.3 ml) to form a perovskite film. The perovskite film was dried at 150 degrees C. for 30 minutes to form a perovskite layer. The perovskite layer was formed so as to have an average thickness of 200 nm or more but 350 nm or less. The stack obtained in the above step was subjected to laser processing, to form a groove so that the distance from the adjacent stack would be 10 μm.

Next. 36.8 mg of a polymer represented as Exemplary Compound 15 (weight average molecular weight=20,000, ionization potential: 5.22 eV), 36.8 mg of 2,2(7,7(-tetrakis-(N,N-di-p-metohxyphenylamine)9,9(-spirobifluorene))) (hereinafter referred to as “spiro-OMeTAD”, obtained from Merck, molecular weight=1225.4, ionization potential=5.09 eV), 4.9 mg of lithium bis(trifluoromethanesulfonyl)imide. 6.8 mg of 4-t-butylpyridine (obtained from Tokyo Chemical Industry Co., Ltd., B0388), and 0.1 mg of tris(2-(1H-pyrazol-1-yl)-4-tert-butlpyridine)cobalt(III) haxafuorophosphate (obtained from Greatcell Solar, MS210205) were weighed and dissolved in 1.5 mL of chlorobenzene (obtained from KANTO CHEMICAL CO., INC.). The obtained solution was spin-coated on the stack obtained in the above step to form a hole transporting layer. The hole transporting layer was formed so as to have an average thickness (at part on the perovskite layer) of from 100 nm through 200 nm. The difference between the ionization potentials of the above two kinds of hole transporting materials was 0.13 eV.

Furthermore, gold (obtained from Tanaka Kikinzoku Kogyo K.K.) was vapor-deposited in vacuum on the above stack to have a thickness of 100 nm.

After that, the end portion to be provided with a sealing member was etched through laser processing, followed by performing additional laser processing to form a through hole (a conduction portion) for coupling photoelectric conversion elements in series. Next, silver was vapor-deposited in vacuum on the above stack to form a second electrode having a thickness of about 100 nm. Through film formation using a mask, the distance from the adjacent second electrode was adjusted to 200 μm. Also, it was confirmed that silver was vapor-deposited on the inner wall of the through hole and the adjacent photoelectric conversion elements were coupled in series.

Next, the material of a surface protection portion; i.e., a fluorine-based silane compound (obtained from HARVES Co., Ltd., DURASURF DS-5935F130, a compound represented by General Formula (A)) was spin-coated on the second electrode, to form a surface protection portion having an average thickness of 50 nm. The surface protection portion formed entirely covered the exposed surface in the second electrode.

Next, an adhesive layer-attached sealing film having an aluminum PET base (obtained from tesa tape K.K.) was used as a sealing member to cover the photoelectric conversion module, followed by laminating using a laminator at a pressure of $5.0\times10^5$ Pa, a temperature of 70 degrees C., and a speed of 1.0 m/min. The water vapor transmission rate per day of the gas barrier member of the sealing member was 10 $g/m^2$ or less.

In the same manner as in Example 1, the evaluation of solar cell characteristics was performed, and further the evaluation of detachment of the electrode, the evaluation of durability during storage under normal temperature and normal humidity, and the evaluation of durability during storage under high temperature and high humidity were performed. Results are presented in Table 1.

[Chem. 43]

Exemplary Compound 15

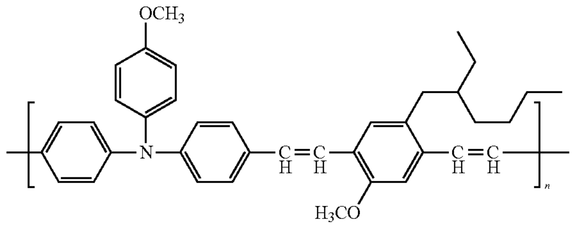

Comparative Example 1

<Production of Photoelectric Conversion Module>

A photoelectric conversion module was produced in the same manner as in the production of the photoelectric conversion module of Example 5, except that the material of the surface protection portion was changed to a dispersion liquid of aluminum oxide nanoparticles (obtained from Sigma-Aldrich) and the average thickness of the surface protection portion to be formed was changed to 10 μm.

In the same manner as in Example 1, the evaluation of solar cell characteristics was performed, and further the evaluation of detachment of the electrode, the evaluation of durability during storage under normal temperature and normal humidity, and the evaluation of durability during storage under high temperature and high humidity were performed. Results are presented in Table 1.

Comparative Example 2

<Production of Photoelectric Conversion Module>

A photoelectric conversion module was produced in the same manner as in the production of the photoelectric conversion module of Example 5, except that the material of the surface protection portion was changed to a dispersion liquid of zirconium oxide nanoparticles (obtained from TAKI CHEMICAL CO., LTD.) and the average thickness of the surface protection portion to be formed was changed to 10 μm.

In the same manner as in Example 1, the evaluation of solar cell characteristics was performed, and further the evaluation of detachment of the electrode, the evaluation of durability during storage under normal temperature and normal humidity, and the evaluation of durability during storage under high temperature and high humidity were performed. Results are presented in Table 1.

Comparative Example 3

<Production of Photoelectric Conversion Module>

A photoelectric conversion module was produced in the same manner as in the production of the photoelectric conversion module of Example 5, except that the material of the surface protection portion was changed to a fluororesin (obtained from Fluoro Technology) and the average thickness of the surface protection portion to be formed was changed to 10 μm. In the same manner as in Example 1, the evaluation of solar cell characteristics was performed, and further the evaluation of detachment of the electrode, the evaluation of durability during storage under normal temperature and normal humidity, and the evaluation of durability during storage under high temperature and high humidity were performed. Results are presented in Table 1.

Comparative Example 4

<Production of Photoelectric Conversion Module>

A photoelectric conversion module was produced in the same manner as in the production of the photoelectric conversion module of Example 5, except that the surface protection portion was not formed.

In the same manner as in Example 1, the evaluation of solar cell characteristics was performed, and further the evaluation of detachment of the electrode, the evaluation of durability during storage under normal temperature and normal humidity, and the evaluation of durability during storage under high temperature and high humidity were performed.

Results are presented in Table 1.

Comparative Example 5

<Production of Photoelectric Conversion Module>

A photoelectric conversion module was produced in the same manner as in the production of the photoelectric conversion module of Example 19, except that the material of the surface protection portion was changed to a dispersion liquid of aluminum oxide nanoparticles (obtained from Sigma-Aldrich) and the average thickness of the surface protection portion to be formed was changed to 10 μm.

In the same manner as in Example 1, the evaluation of solar cell characteristics was performed, and further the evaluation of detachment of the electrode, the evaluation of durability during storage under normal temperature and normal humidity, and the evaluation of durability during storage under high temperature and high humidity were performed. Results are presented in Table 1.

Comparative Example 6

<Production of Photoelectric Conversion Module>

A photoelectric conversion module was produced in the same manner as in the production of the photoelectric conversion module of Example 19, except that the surface protection portion was not formed.

In the same manner as in Example 1, the evaluation of solar cell characteristics was performed, and further the evaluation of detachment of the electrode, the evaluation of durability during storage under normal temperature and normal humidity, and the evaluation of durability during storage under high temperature and high humidity were performed. Results are presented in Table 1.

Comparative Example 7

<Production of Photoelectric Conversion Module>

A photoelectric conversion module was produced in the same manner as in the production of the photoelectric conversion module of Example 20, except that the material of the surface protection portion was changed to a dispersion liquid of aluminum oxide nanoparticles (obtained from Sigma-Aldrich) and the average thickness of the surface protection portion to be formed was changed to 10 μm.

In the same manner as in Example 1, the evaluation of solar cell characteristics was performed, and further the evaluation of detachment of the electrode, the evaluation of durability during storage under normal temperature and normal humidity, and the evaluation of durability during storage under high temperature and high humidity were performed. Results are presented in Table 1.

Comparative Example 8

<Production of Photoelectric Conversion Module>

A photoelectric conversion module was produced in the same manner as in the production of the photoelectric conversion module of Example 20, except that the surface protection portion was not formed.

In the same manner as in Example 1, the evaluation of solar cell characteristics was performed, and further the evaluation of detachment of the electrode, the evaluation of durability during storage under normal temperature and normal humidity, and the evaluation of durability during storage under high temperature and high humidity were performed. Results are presented in Table 1.

TABLE 1

| | Evaluation of electrode detachment | Evaluation of durability during storage (under normal temperature and normal humidity) | Evaluation of durability during storage (under high temperature and high humidity) |
|---|---|---|---|
| Ex. 1 | 1.4% | 9% | 20% |
| Ex. 2 | 0% | 8% | 21% |
| Ex. 3 | 1.4% | 8% | 19% |
| Ex. 4 | 0% | 9% | 18% |
| Ex. 5 | 0.7% | 9% | 18% |
| Ex. 6 | 0% | 10% | 21% |
| Ex. 7 | 0.4% | 8% | 18% |
| Ex. 8 | 0% | 9% | 17% |
| Ex. 9 | 0% | 9% | 18% |
| Ex. 10 | 0% | 7% | 16% |
| Ex. 11 | 0% | 8% | 17% |
| Ex. 12 | 0.7% | 5% | 15% |
| Ex. 13 | 0.7% | 6% | 14% |
| Ex. 14 | 8.6% | 12% | 28% |
| Ex. 15 | 11.1% | 11% | 25% |
| Ex. 16 | 0% | 9% | 20% |
| Ex. 17 | 0% | 9% | 20% |
| Ex. 18 | 0.4% | 9% | 21% |
| Ex. 19 | 0.7% | 7% | 21% |
| Ex. 20 | 0.7% | 8% | 22% |
| Comp. Ex. 1 | 0.7% | 19% | 69% |
| Comp. Ex. 2 | 0.7% | 18% | 73% |
| Comp. Ex. 3 | 0% | 19% | 72% |
| Comp. Ex. 4 | Electrode detached | Electrode detached | Electrode detached |
| Comp. Ex. 5 | 0.7% | 15% | 77% |

TABLE 1-continued

| | Evaluation of electrode detachment | Evaluation of durability during storage (under normal temperature and normal humidity) | Evaluation of durability during storage (under high temperature and high humidity) |
|---|---|---|---|
| Comp. Ex. 6 | Electrode detached | Electrode detached | Electrode detached |
| Comp. Ex. 7 | 0% | 20% | 80% |
| Comp. Ex. 8 | Electrode detached | Electrode detached | Electrode detached |

It is found from the results of Table 1 that the photoelectric conversion element of the present disclosure is prevented from detachment of the electrode and decreasing in durability during storage even when the photoelectric conversion element is bent, because it includes a surface protection portion adjacent to a face of one electrode selected from the first electrode and the second electrode where the face does not face the photoelectric conversion layer, the surface protection portion containing a compound derived from a fluorine-based silane compound.

The above-described embodiments are illustrative and do not limit the present invention. Thus, numerous additional modifications and variations are possible in light of the above teachings. For example, elements and/or features of different illustrative embodiments may be combined with each other and/or substituted for each other within the scope of the present invention.

This patent application is based on and claims priority to Japanese Patent Application No. 2021-047775 filed on Mar. 22, 2021, in the Japan Patent Office, the entire disclosure of which is hereby incorporated by reference herein.

REFERENCE SINGS LIST

1 photoelectric conversion element
2 photoelectric conversion region
3 seal region
4 other members
11 UV cut layer
12 base
13 first electrode
14 first electron transporting layer
15 second electron transporting layer (intermediate layer)
16 photoelectric conversion layer
17 hole transporting layer
18 second electrode
19 surface protection portion
20 sealing member
21 adhesive member
22 gas barrier member
30 adhesion region

The invention claimed is:

1. A photoelectric conversion element, comprising:

a first electrode;

a photoelectric conversion layer over the first electrode;

a second electrode over the photoelectric conversion layer; and a surface protection portion adjacent to a face of the second electrode where the face does not face the photoelectric conversion layer, the surface protection portion containing a compound derived from a fluorine-based silane compound having at least one alkoxysilyl group; and a sealing member comprising an adhesive member and a gas barrier member, wherein said adhesive member adheres to a surface of said surface protection portion where the surface does not face the second electrode, wherein the fluorine-based silane compound having at least one alkoxysilyl group is a compound represented by General Formula (A) below, and a molecular weight of the fluorine-based silane compound having at least one alkoxysilyl group is 1.000 or lower:

$$CF_3(CH_2)_q—O(CF_2CF_2O)_m(CF_2)_p(CH_2)_nSiR^1_{(3-a)}(OR^2)_a$$ General Formula (A)

where in the General Formula (A), $R^1$ and $R^2$ each independently represent a monovalent hydrocarbon group having carbon atoms of 1 or more but 4 or less, a represents an integer of 2 or 3, p represents an integer of 1 or 2, q represents an integer of 0 or greater but 5 or smaller, m represents an integer of 1 or greater but 3 or smaller, n represents an integer of 2 or greater but 4 or smaller, and p+q+2m+n represents an integer of 5 or greater but 14 or smaller.

2. The photoelectric conversion element according to claim 1, wherein an average thickness of the surface protection portion is 1 μm or less.

3. The photoelectric conversion element according to claim 1, wherein the surface protection portion entirely covers an exposed surface in the second electrode.

4. The photoelectric conversion element according to claim 1, further comprising a base facing a face of an other electrode selected from the first electrode and the second electrode where the face of the other electrode does not face the photoelectric conversion layer, wherein the base is a resin film or is of glass, and a thickness of the base is 200 μm or less.

5. The photoelectric conversion element according to claim 4, wherein a water vapor transmission rate per day of the base is 10 g/m$^2$ or less.

6. The photoelectric conversion element according to claim 1, wherein a water vapor transmission rate per day of the gas barrier member is 10 g/m$^2$ or less.

7. The photoelectric conversion element according to claim 1, further comprising:

an electron transporting layer between the first electrode and the photoelectric conversion layer; and a hole transporting layer between the photoelectric conversion layer and the second electrode.

8. The photoelectric conversion element according to claim 1, wherein the photoelectric conversion layer includes an organic material having a highest occupied molecular orbital (HOMO) level of 5.1 eV or higher but 5.5 eV or lower and a number average molecular weight (Mn) of 10,000 or lower.

9. The photoelectric conversion element according to claim 8, wherein the photoelectric conversion layer further includes an organic material having a highest occupied molecular orbital (HOMO) level of 5.2 eV or higher but 5.6 eV or lower and a number average molecular weight (Mn) of 10,000 or higher.

10. The photoelectric conversion element according to claim 1, wherein the photoelectric conversion layer includes a compound represented by General Formula (1) below:

General Formula (1)

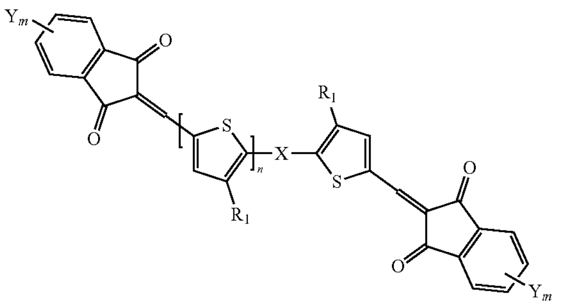

where in the General Formula (1),

R represents an alkyl group having carbon atoms of 2 or more but 8 or less, n represents an integer of 1 or greater but 3 or smaller, X represents General Formula (2) below or General Formula (3) below, Y represents a halogen atom, and m represents an integer of 0 or greater but 4 or smaller, General Formula (2)

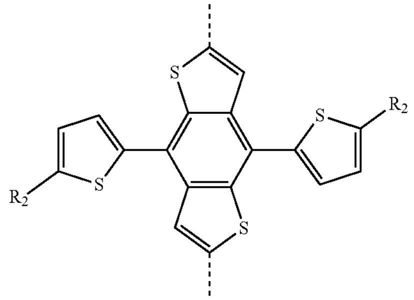

where in the General Formula (2), $R^2$ represents a straight-chain or branched alkyl group, General Formula (3)

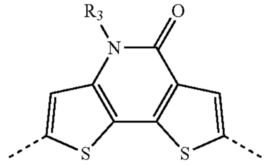

where in the General Formula (3), $R^3$ represents a straight-chain or branched alkyl group.

11. The photoelectric conversion element according to claim 1, wherein the photoelectric conversion layer includes an organic material comprising a fullerene derivative.

12. The photoelectric conversion element according to claim 7, wherein the electron transporting layer includes a first electron transporting layer and a second electron transporting layer between the first electron transporting layer and the photoelectric conversion layer, the first electron transporting layer includes particles of a metal oxide, and the second electron transporting layer includes an amine compound represented by General Formula (4) below:

General Formula (4)

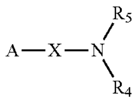

where in the General Formula (4), $R^4$ and $R^5$ each independently represent an alkyl group which may have a substituent and contains carbon atoms of 1 or more but 4 or less, or represent a ring structure where $R^4$ and $R_5$ are bonded to each other, X represents a divalent aromatic group having carbon atoms of 6 or more but 14 or less or an alkyl group having carbon atoms of 1 or more but 4 or less, and A represents a substituent of Structural Formula (1), (2), or (3) below:

$-COOH$ Structural Formula (1), $P(=O)(OH)_2$ Structural Formula (2), $-Si(OH)_3$ Structural Formula (3).

13. A photoelectric conversion module, comprising:

a first photoelectric conversion element and a second photoelectric conversion element adjacent to each other, each of the first photoelectric conversion element and the second photoelectric conversion element being the photoelectric conversion element according to claim 1; and a partition portion containing the compound derived from the fluorine-based silane compound between the one electrode in the first photoelectric conversion element and the one electrode in the second photoelectric conversion element, the partition portion being in contact with the photoelectric conversion layer in the first photoelectric conversion element.

14. An electronic device, comprising:

the photoelectric conversion element according to claim 1; and a device that is electrically coupled to the photoelectric conversion element.

15. An electronic device, comprising:

the photoelectric conversion element according to claim 1;

a storage cell that is electrically coupled to the photoelectric conversion element; and a device that is electrically coupled to the photoelectric conversion element and the storage cell.

16. A power supply module, comprising:

the photoelectric conversion element according to claim 1; and a power supply IC that is electrically coupled to the photoelectric conversion element.

* * * * *